(12) United States Patent
Otake et al.

(10) Patent No.: US 8,193,810 B2
(45) Date of Patent: Jun. 5, 2012

(54) MRI APPARATUS WITH RF SURFACE COIL HAVING AT LEAST THREE RESONANCE FREQUENCIES

(75) Inventors: Yosuke Otake, Kokubunji (JP); Yoshihisa Soutome, Tokyo (JP); Koji Hirata, Kasukabe (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 277 days.

(21) Appl. No.: 12/292,449

(22) Filed: Nov. 19, 2008

(65) Prior Publication Data

US 2009/0128155 A1    May 21, 2009

(30) Foreign Application Priority Data

Nov. 19, 2007  (JP) .................. 2007-299622

(51) Int. Cl.
*G01V 3/00* (2006.01)
(52) U.S. Cl. ......... 324/318; 324/322; 324/309; 324/307
(58) Field of Classification Search .......... 324/300–322; 600/407–435; 382/128–131; 333/219–235; 335/296–306; 330/4.7
See application file for complete search history.

(56) References Cited

U.S. PATENT DOCUMENTS

| | | | | |
|---|---|---|---|---|
| 3,315,174 A | * | 4/1967 | Adler | 330/4.7 |
| 3,378,760 A | * | 4/1968 | Jackson et al. | 324/301 |
| 3,439,260 A | * | 4/1969 | Bene | 324/303 |
| 5,202,635 A | * | 4/1993 | Srinivasan et al. | 324/322 |
| 5,212,450 A | * | 5/1993 | Murphy-Boesch et al. | 324/322 |
| 5,243,289 A | * | 9/1993 | Blum et al. | 324/322 |
| 6,081,120 A | * | 6/2000 | Shen | 324/318 |
| 6,590,394 B2 | * | 7/2003 | Wong et al. | 324/318 |
| 6,828,791 B2 | * | 12/2004 | Morita et al. | 324/318 |
| 7,081,753 B2 | * | 7/2006 | Mullen et al. | 324/318 |
| 7,084,634 B2 | * | 8/2006 | Morita et al. | 324/321 |
| 7,138,802 B2 | * | 11/2006 | Morita et al. | 324/318 |
| 7,446,528 B2 | * | 11/2008 | Doddrell et al. | 324/318 |
| 2003/0160614 A1 | * | 8/2003 | Morita et al. | 324/318 |
| 2005/0083059 A1 | * | 4/2005 | Morita et al. | 324/318 |
| 2006/0017438 A1 | * | 1/2006 | Mullen et al. | 324/318 |
| 2006/0119358 A1 | * | 6/2006 | Doddrell et al. | 324/318 |
| 2006/0186885 A1 | * | 8/2006 | Morita et al. | 324/318 |
| 2007/0285096 A1 | * | 12/2007 | Soutome et al. | 324/318 |
| 2009/0128155 A1 | * | 5/2009 | Otake et al. | 324/322 |

OTHER PUBLICATIONS

Joseph Murphy-Boesch et al., "An In Vivo NMR Probe Circuit for Improved Sensitivity", Journal of Magnetic Resonance, vol. 54, 1983, pp. 526-532.

* cited by examiner

*Primary Examiner* — Melissa Koval
*Assistant Examiner* — Tiffany Fetzner
(74) *Attorney, Agent, or Firm* — Stites & Harbison, PLLC; Juan Carlos A. Marquez, Esq

(57) ABSTRACT

An RF coil having at least three different resonance frequencies, wherein one of the resonance frequencies is adjusted to be a frequency $f_A$ of a magnetic resonance signal generated by a test subject, and the coil is adjusted so that ratio of difference between the frequency $f_A$ and a first frequency $f_B$ lower than $f_A$ and nearest to $f_A$ among the resonance frequencies ($f_A - f_B$), and difference between the frequency $f_A$ and a second resonance frequency $f_C$ higher than $f_A$ and nearest to the frequency $f_A$ among the resonance frequencies ($f_C - f_A$), should be from 0.5 to 2.0. There is provided a technique for receiving magnetic resonance signals always with high detection efficiency by an RF coil of an MRI apparatus even if significant loss is caused in the RF coil, or test subject is changed.

13 Claims, 20 Drawing Sheets

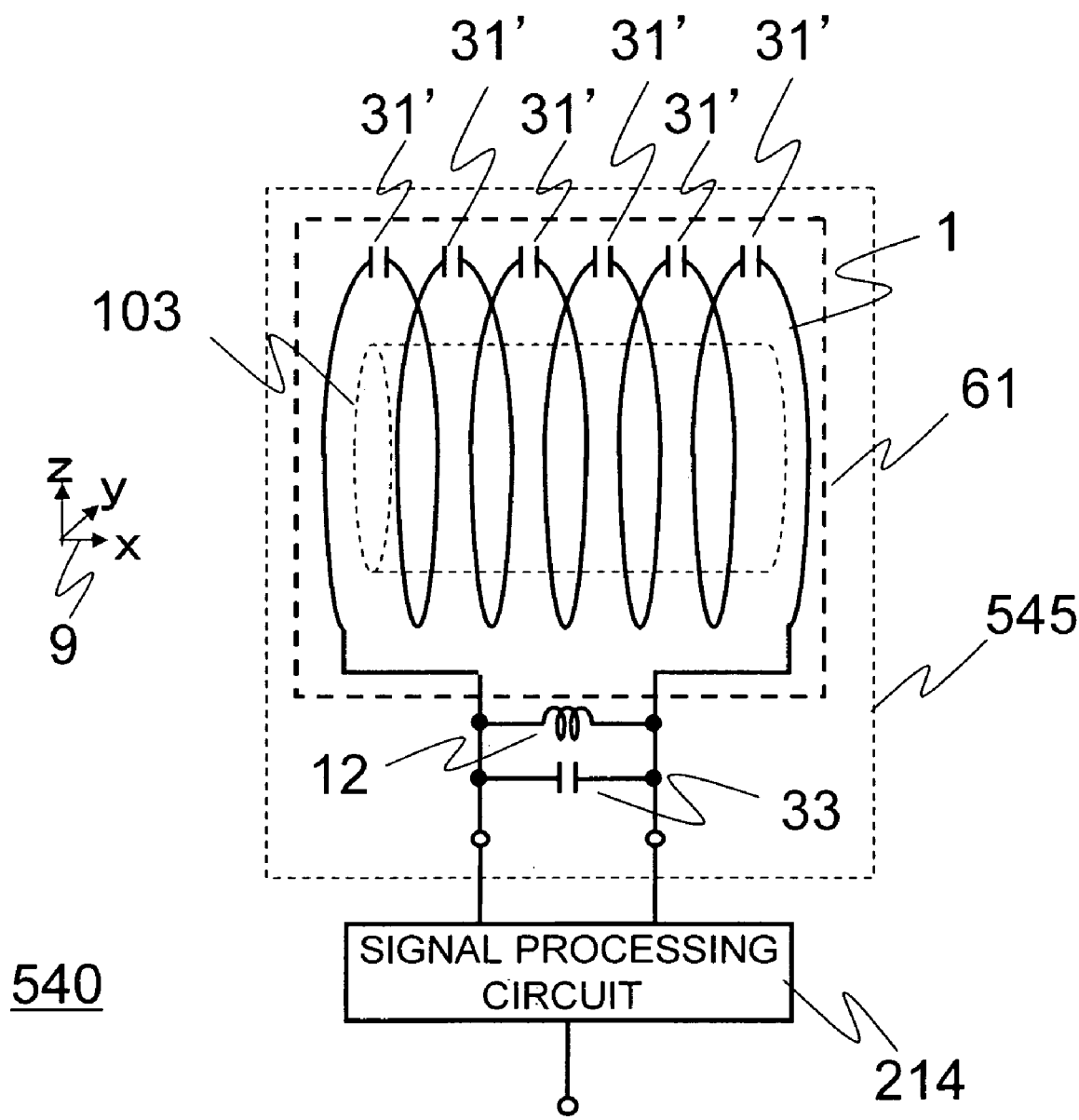

14   34

550

14

551

34

541

542

543

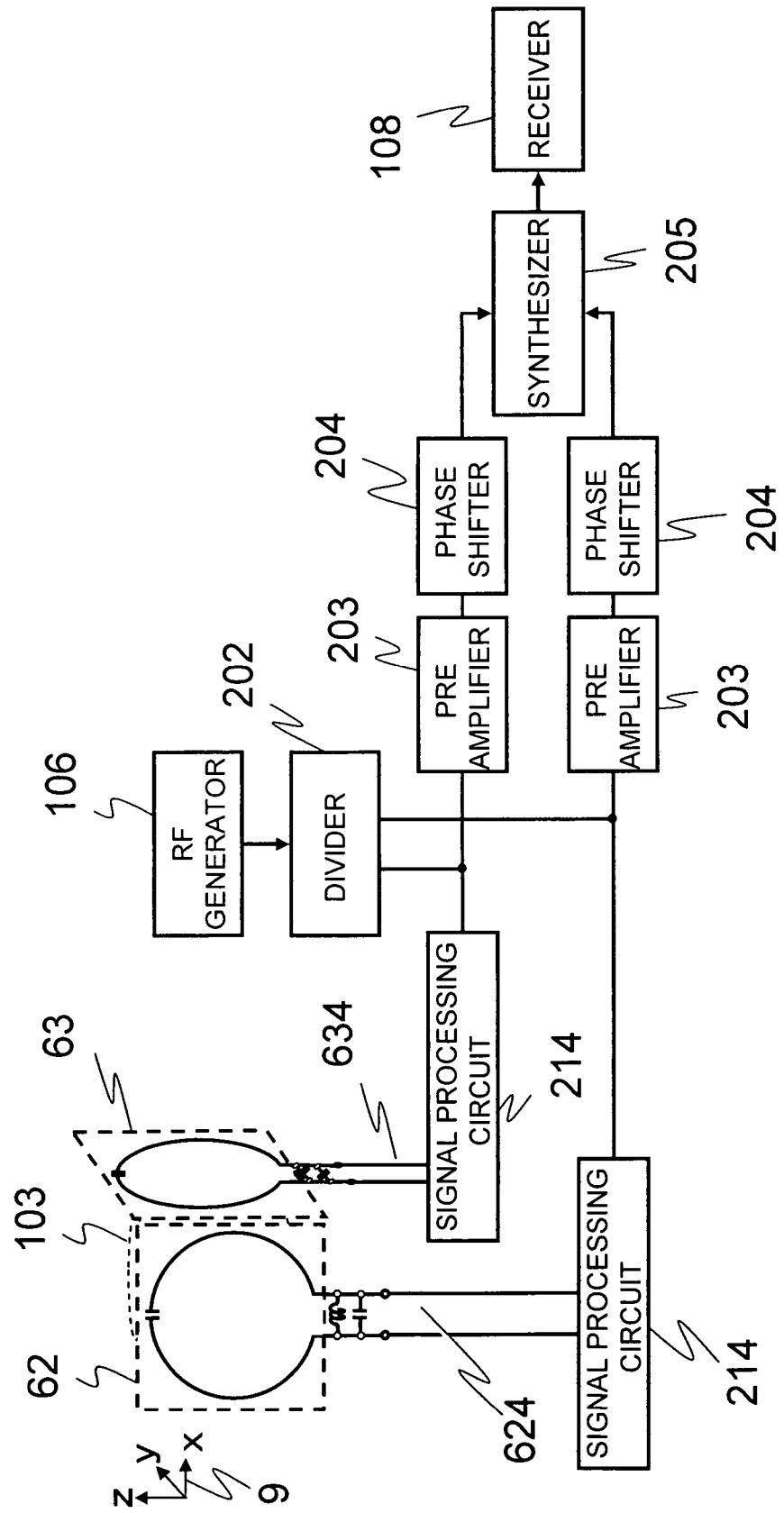

ically, the present invention provides an RF coil of a
MRI APPARATUS WITH RF SURFACE COIL HAVING AT LEAST THREE RESONANCE FREQUENCIES

CLAIM OF PRIORITY

The present application claims priority from Japanese Patent Application No. 2007-299622 filed on Nov. 19, 2007, the content of which is hereby incorporated by reference into this application.

BACKGROUND OF THE INVENTION

The present invention relates to a magnetic resonance imaging (MRI) apparatus, in particular, an RF (radio frequency) coil for obtaining magnetic resonance signals.

MRI apparatus is medical diagnostic imaging apparatus which induce magnetic resonance in nuclei in an arbitrary cross-section passing horizontally through a test subject, and obtaining a tomogram in the section from generated magnetic resonance signals. In general, an RF magnetic field is irradiated by an RF coil to excite hydrogen nuclei ($^1$H), and generated magnetic resonance (RF magnetic field) signals are detected.

An RF coil irradiates an RF magnetic field, and receive magnetic resonance signals. This coil was constructed with parallel resonance circuit or series resonance circuit each having capacitors and inductors. Each resonance circuit is tuned the same frequency as the nuclear magnetic resonance frequency $f_0$ of the nuclei. (refer to, for example, MURPHY-BOESCH, et al., "An In Vivo NMR Probe Circuit for Improved Sensitivity", Journal of Magnetic Resonance, USA, 1983, 54, p.526-532). Since the nuclear magnetic resonance frequency $f_0$ becomes higher in proportion to the magnetic field intensity, the RF coil used for an MRI apparatus using a high magnetic field must be designed so that it should resonate at a high frequency. At present, as shown in FIG. 20A, capacitors are inserted into the loop of the RF coil to reduce the combined capacity of the capacitors, and thereby increase the resonance frequency.

In general, in order to efficiently convey power to the RF coil from a cable, it is necessary to attain impedance matching between the cable and the RF coil. Moreover, in order to efficiently generate an RF magnetic field with the RF coil, it is necessary to make phase of 0 degree. Therefore, the RF coil is designed so that impedance matching should be attained, and phase should become 0 degree at a magnetic resonance frequency $f_0$ which is a resonance frequency $f_R$ of the RF coil. The impedance is adjusted to, for example, 50Ω. As shown in FIG. 20B, frequency characteristics of phase and impedance when the RF coil of FIG. 20A is adjusted as described above. Where $f_R$ is resonance frequency.

However, if a test subject is placed in an RF coil, loss is caused in the RF coil by the coupling of the test subject and the RF coil. And the frequency characteristic of the coil changes. The frequency characteristic in such a case is shown in FIG. 20C. When loss is caused in the RF coil, the impedance falls at the resonance frequency $f_R$, and change of the phase around the resonance frequency $f_R$ becomes mild as shown in FIG. 20C. As a result, the impedance shifts from 50Ω at the magnetic resonance frequency $f_0$, which is the resonance frequency $f_R$, and the phase is also no longer 0 degree. Therefore, the RF coil cannot generate and detect signals at the magnetic resonance frequency, and sufficient sensitivity cannot be obtained.

To solve this problem, when a test subject is inserted in an RF coil, value of the capacitor is conventionally readjusted to make values of the impedance and phase 50Ω and 0 degree, respectively, at the nuclear magnetic resonance frequency $f_0$ to obtain magnetic resonance signals.

SUMMARY OF THE INVENTION

Since the values of impedance and phase depend on size and physical properties of a test subject, retune is needed whenever test subject is changed. If capacity of the capacitor is changed to adjust the phase, it takes time and effort, and it is difficult to maintain precision of the adjustment. For this reason, it is difficult to maintain high detection efficiency with an RF coil.

In particular, when imaging is performed by using an MRI apparatus using a high magnetic field intensity higher than 3 T (tesla) or by using a highly sensitive RF coil, coupling of a test subject and an RF coil becomes strong, and therefore significant loss is caused in the RF coil. As a result, frequency characteristic of the RF coil significantly changes as shown in FIG. 20D. Therefore, a large degree of change of capacity of the capacitor is needed for the retune.

However, in an RF coil of an MRI apparatus using a high magnetic field or a highly sensitive RF coil, a capacitor having a capacity of 1 pF or less may be used. A capacitor having a capacity of 1 pF or less scarcely allows adjustable range, and shows low durability. Therefore, with such a capacitor, it is difficult to restore magnetic resonance signal detection efficiency by readjusting the RF coil via change of capacity of the capacitor. Further, since degree of the loss caused in an RF coil greatly depends on test subject, difficult adjustment is needed for every test subject in order to maintain detection efficiency.

The present invention was accomplished in view of the aforementioned situation, and aims at providing a technique for receiving magnetic resonance signals by an RF coil of an MRI apparatus always with high detection efficiency even if significant loss is caused in the RF coil, or test subject is changed.

The present invention provides an RF coil having at least three different resonance frequencies, wherein one of the resonance frequencies is adjusted to be a frequency $f_A$ of a magnetic resonance signal generated by a test subject, and ratio of difference between the frequency $f_A$ and a first frequency $f_B$ lower than $f_A$ and nearest to $f_A$ among the resonance frequencies ($f_A$-$f_B$), and difference between the frequency $f_A$ and a second resonance frequency $f_C$ higher than $f_A$ and nearest to the frequency $f_A$ among the resonance frequencies ($f_C$-$f_A$), is from 0.5 to 2.0.

Specifically, the present invention provides an RF coil of a magnetic resonance imaging apparatus comprising a series resonant circuit comprising a loop coil made of a conductor inserted with a first capacitor, an inductor connected in parallel to the series resonant circuit, and a second capacitor connected in parallel to the inductor, wherein resonance frequency of the series resonant circuit is a frequency $f_A$ of a magnetic resonance signal generated by a test subject, a parallel resonant circuit constituted by the series resonant circuit, the inductor and the second capacitor has a first resonance frequency $f_B$ lower than the frequency $f_A$ and a second resonance frequency $f_C$ higher than the frequency $f_A$, and ratio of difference between the frequency $f_A$ and the first frequency $f_B$ ($f_A$-$f_B$), and difference between the frequency $f_A$ and the second resonance frequency $f_C$ ($f_C$-$f_A$), is from 0.5 to 2.0.

According to the present invention, magnetic resonance signals can be received always with high detection efficiency by an RF coil of an MRI apparatus, even if significant loss is caused in the RF coil, or test subject is changed.

BRIEF DESCRIPTION OF THE DIAGRAMS

FIG. 3 shows a schematic view of a solenoid coil according to the first embodiment.

FIG. 4A, FIG. 4B, FIG. 4C, and FIG. 4D are diagrams for explaining operations of general series resonant circuit and parallel resonant circuit.

Figure 5A:
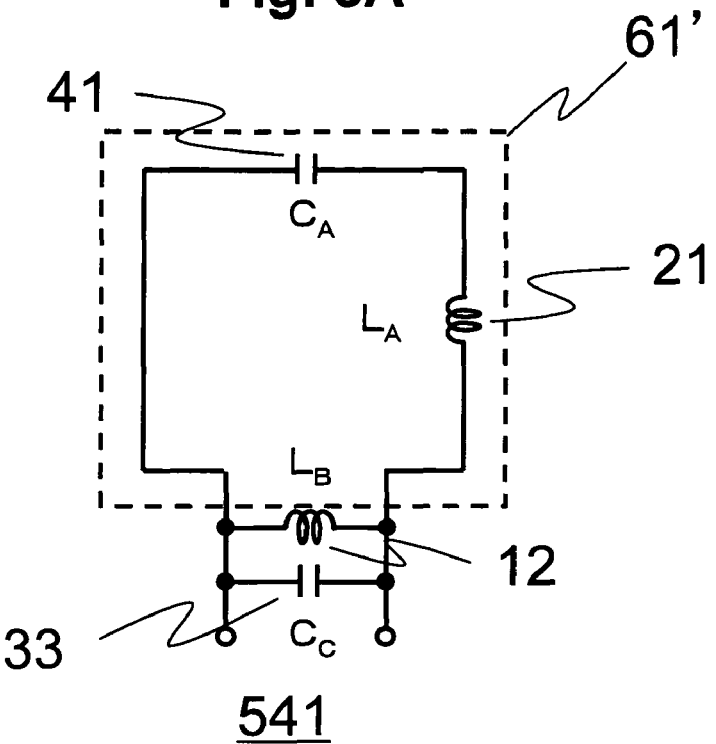
Figure 5B:
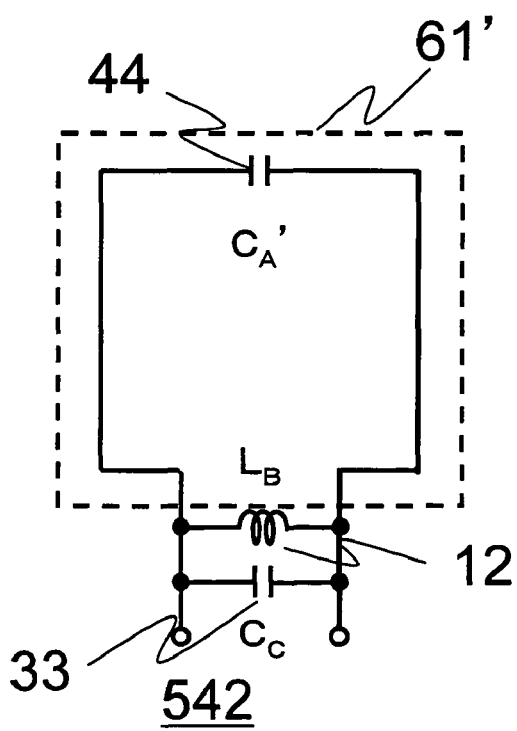
Figure 5C:
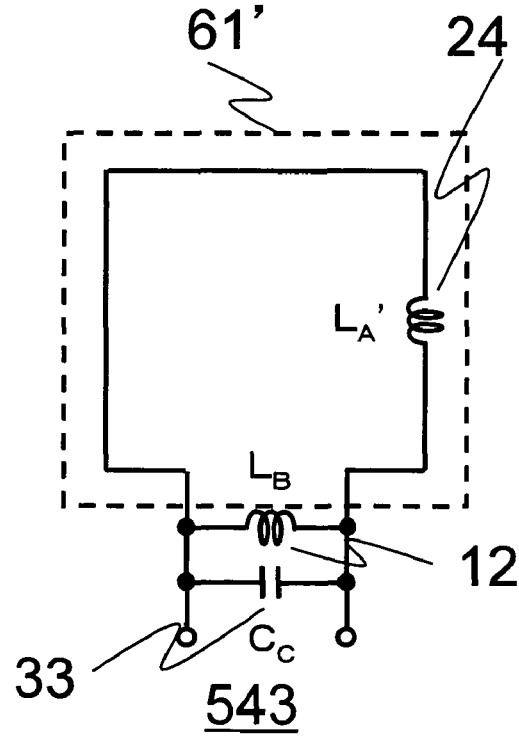

FIG. 5A, FIG. 5B, and FIG. 5C are diagrams for explaining operation of a solenoid coil of the first embodiment.

Figure 6A:
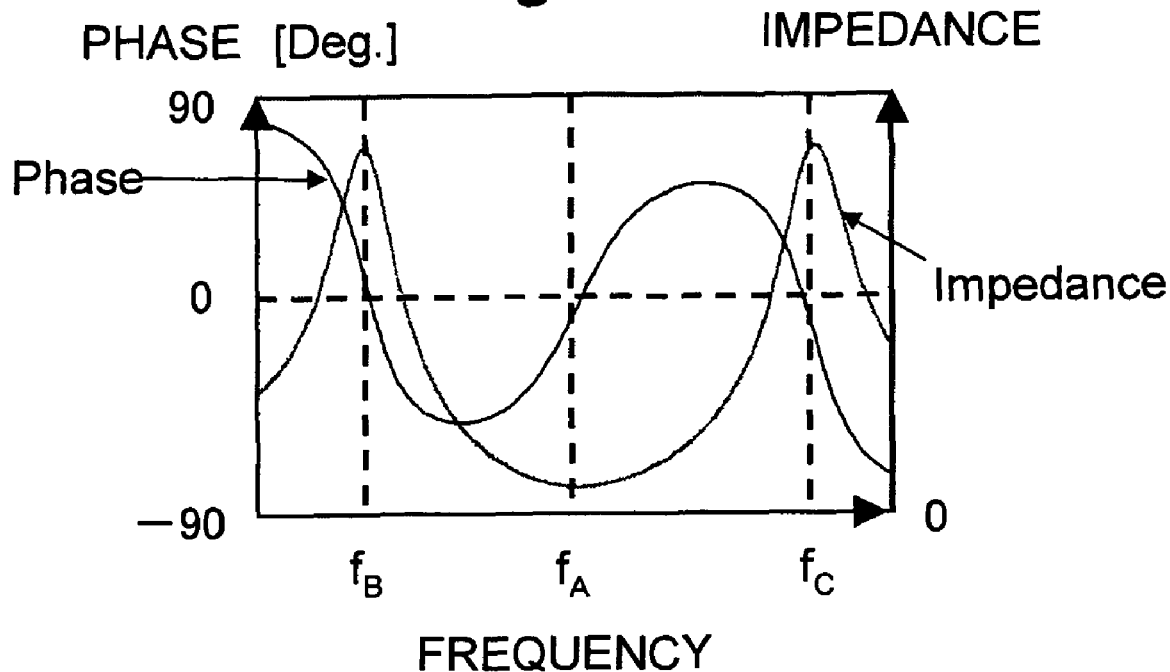
Figure 6B:
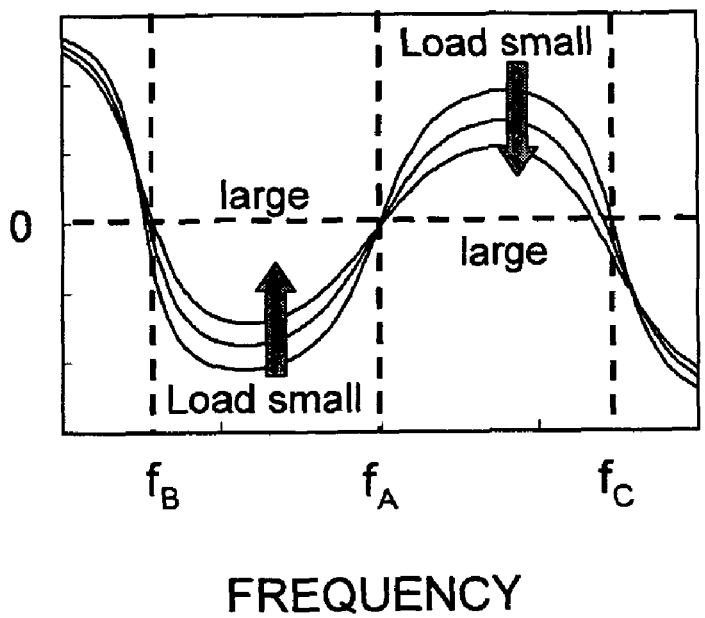

FIG. 6A, and FIG. 6B are diagrams showing frequency characteristics of a solenoid coil according to the first embodiment.

FIG. 7A, FIG. 7B, FIG. 7C, FIG. 7D, and FIG. 7E are diagrams for explaining the method for choosing $f_B$ and $f_C$ of the solenoid coil according to the first embodiment.

Figure 8A:
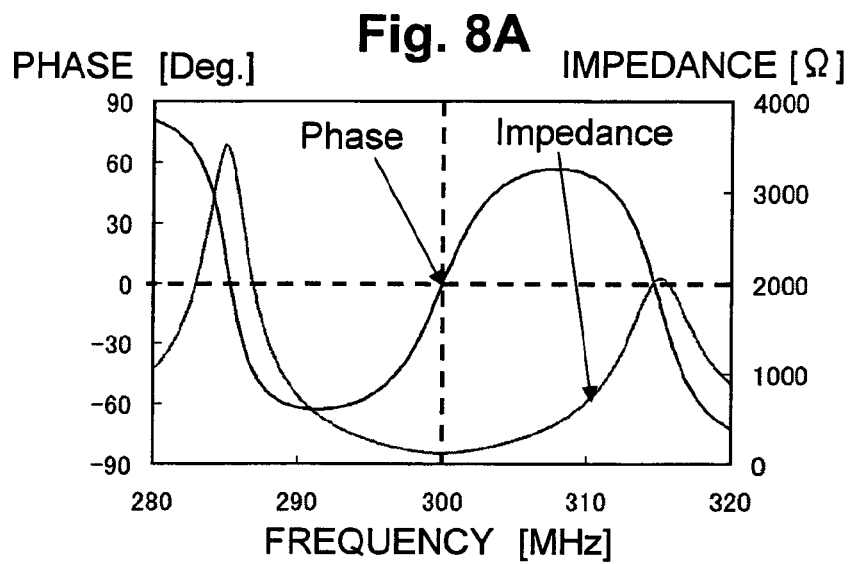
Figure 8B:
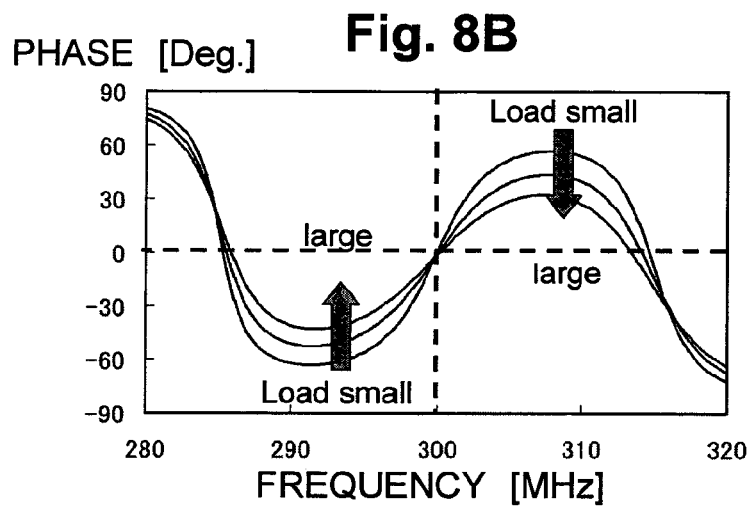
Figure 8C:
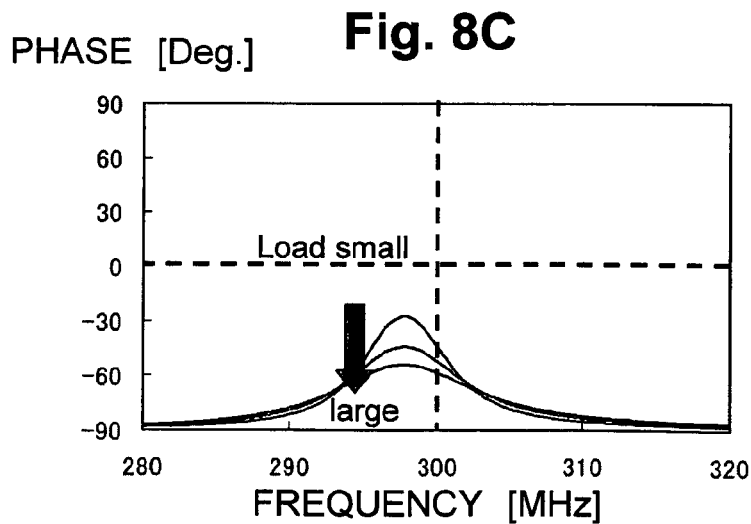

FIG. 8A, FIG. 8B, and FIG. 8C show results of simulation of a solenoid coil according to the first embodiment.

Figure 9:
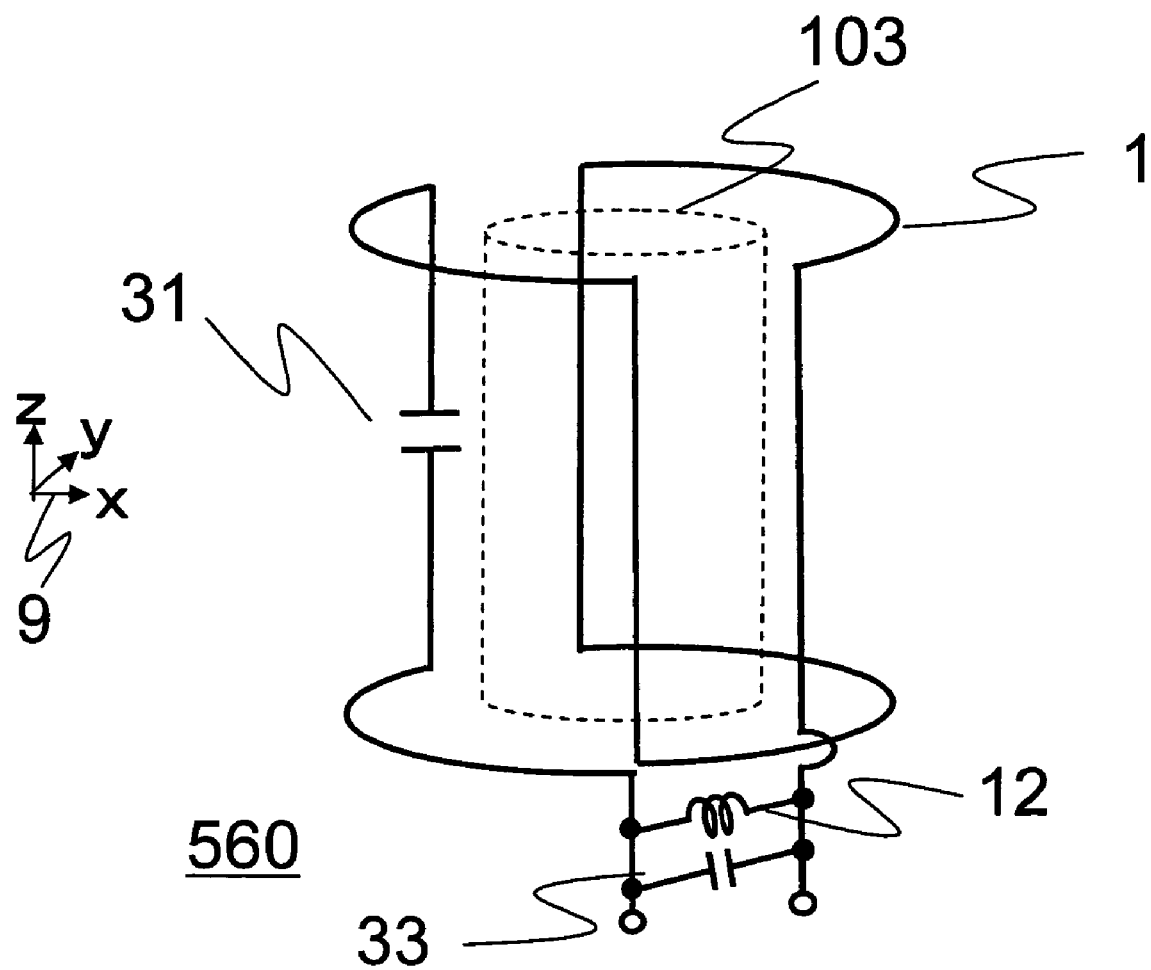

FIG. 9 shows a schematic view of a saddle coil according to the first embodiment.

Figure 10:
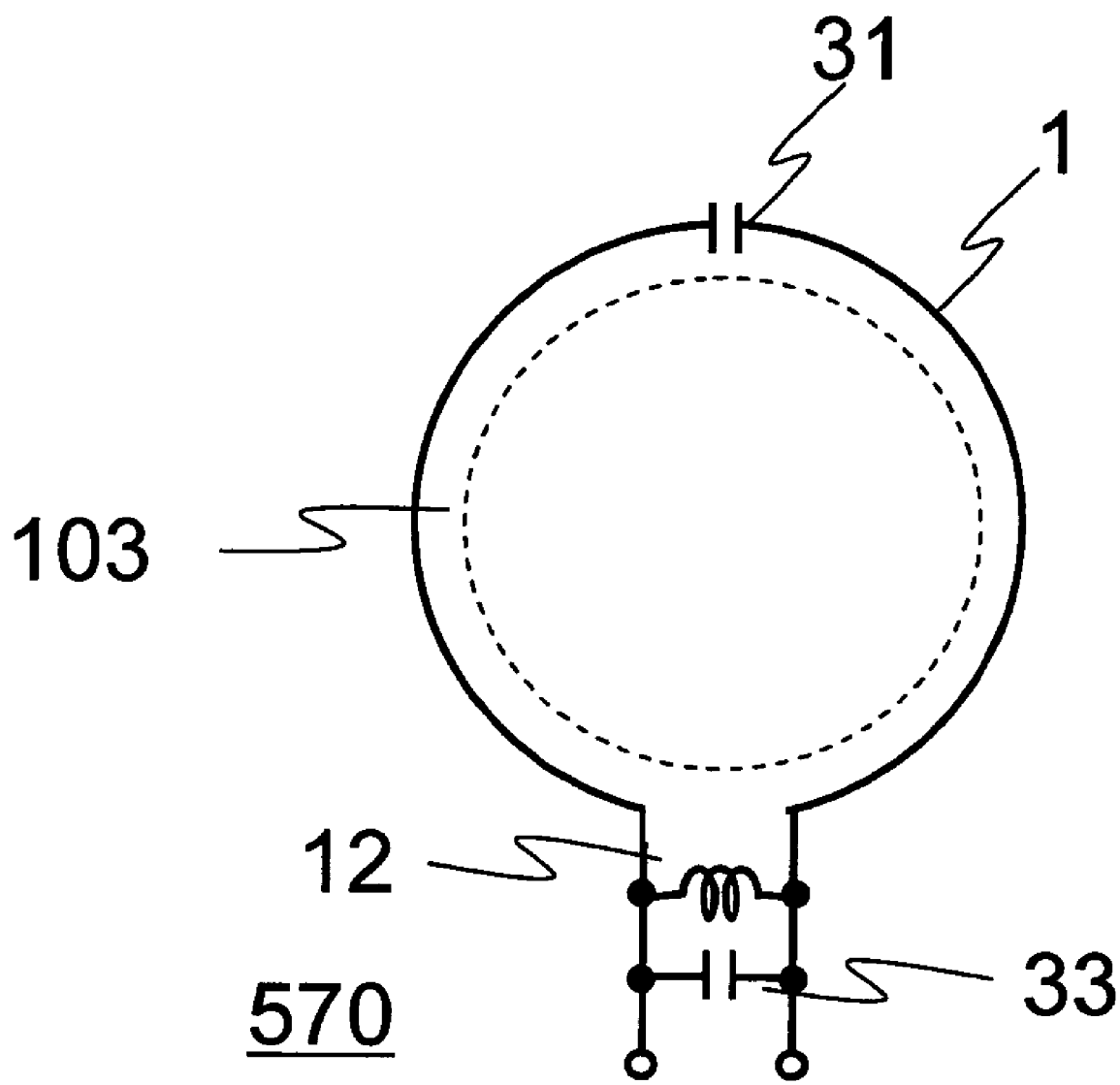

FIG. 10 shows a schematic view of a surface coil according to the first embodiment.

Figure 11:
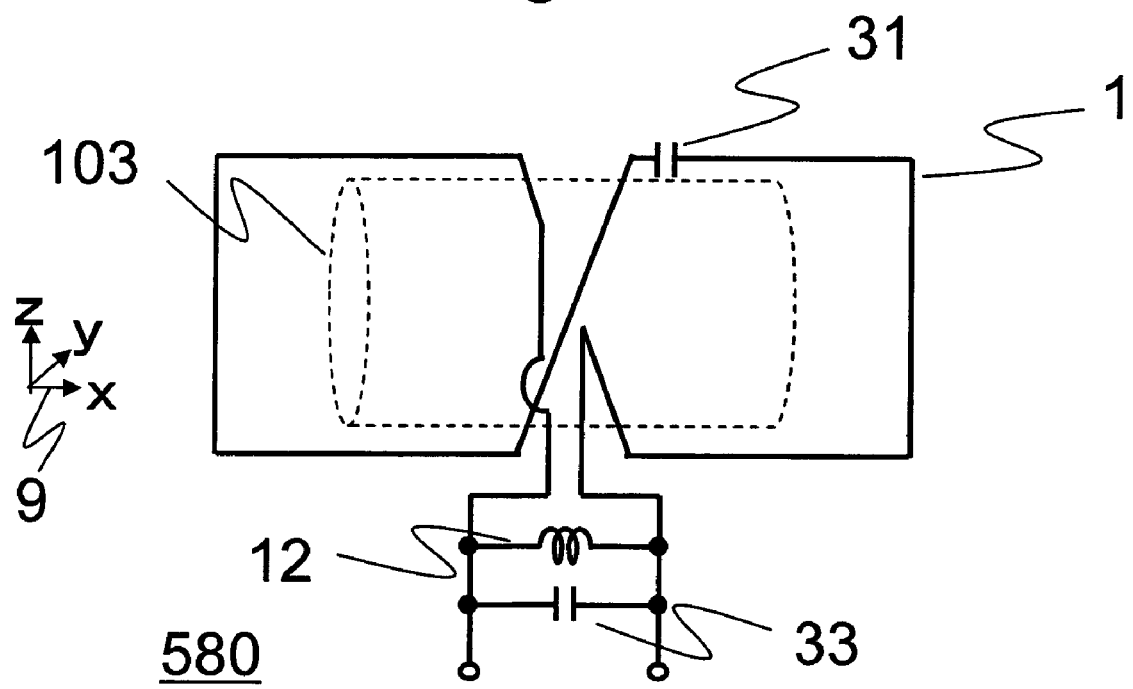

FIG. 11 shows a schematic view of a butterfly coil according to the first embodiment.

Figure 12A:
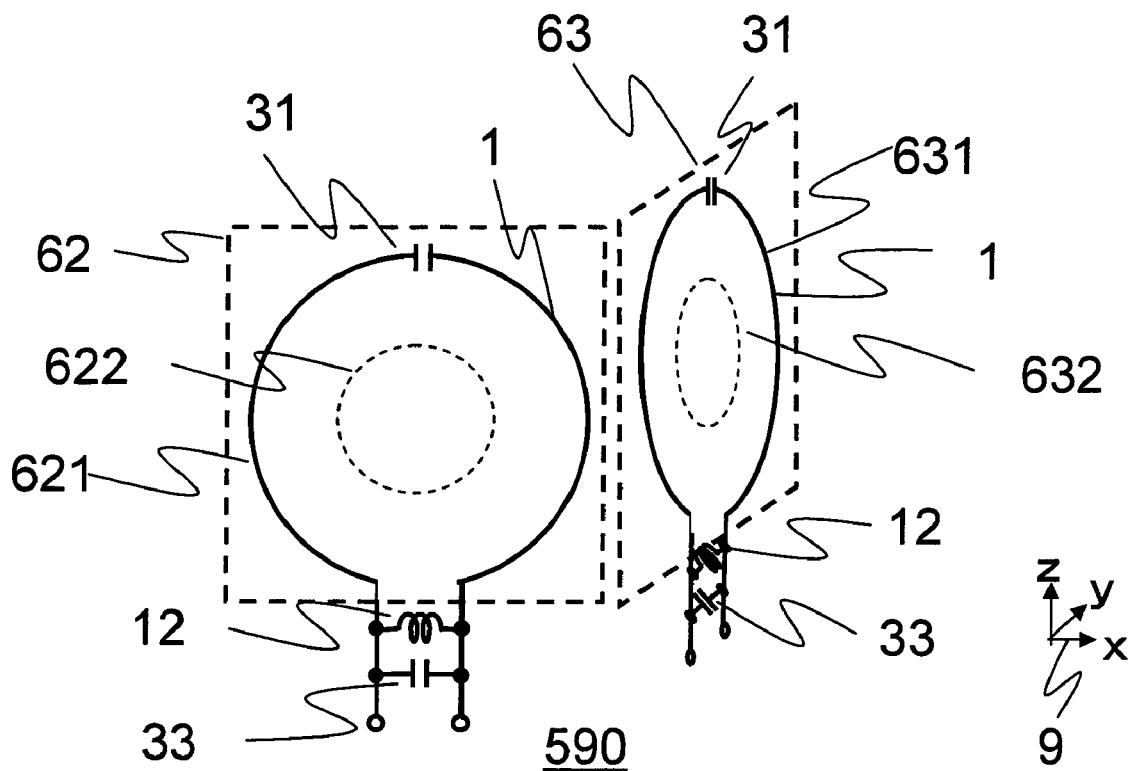
Figure 12B:
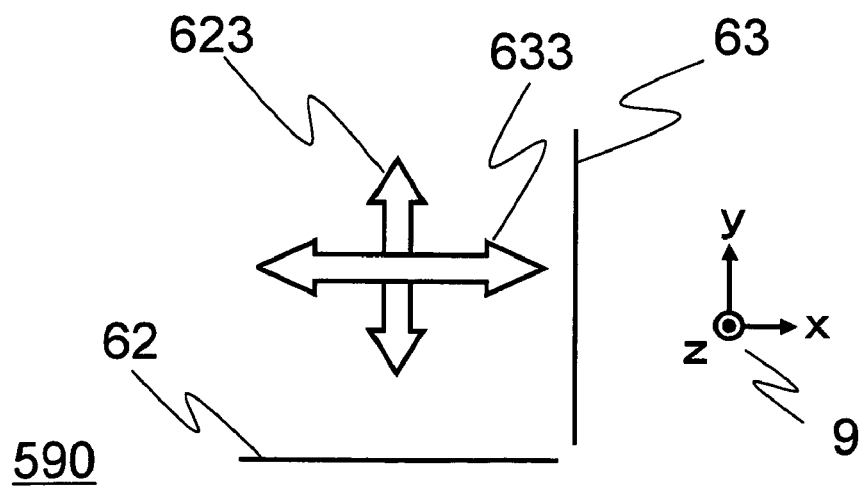

FIG. 12A, and FIG. 12B are schematic views of transmit and receive RF coil according to the second embodiment.

FIG. 13 shows an example of connection of a transmit and receive RF coil according to the second embodiment.

Figure 14:
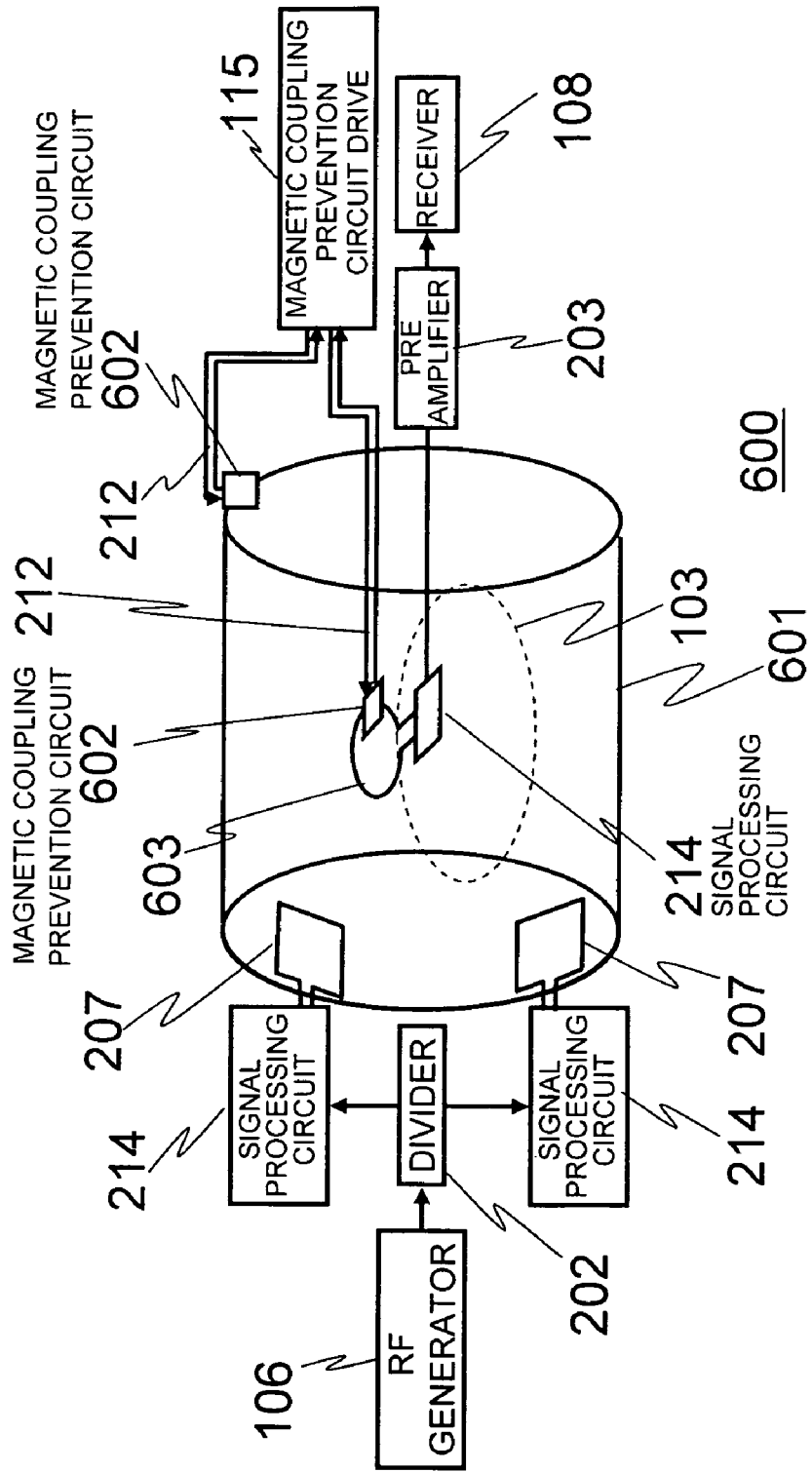

FIG. 14 shows connection relation of an RF coil according to the third embodiment.

Figure 15:
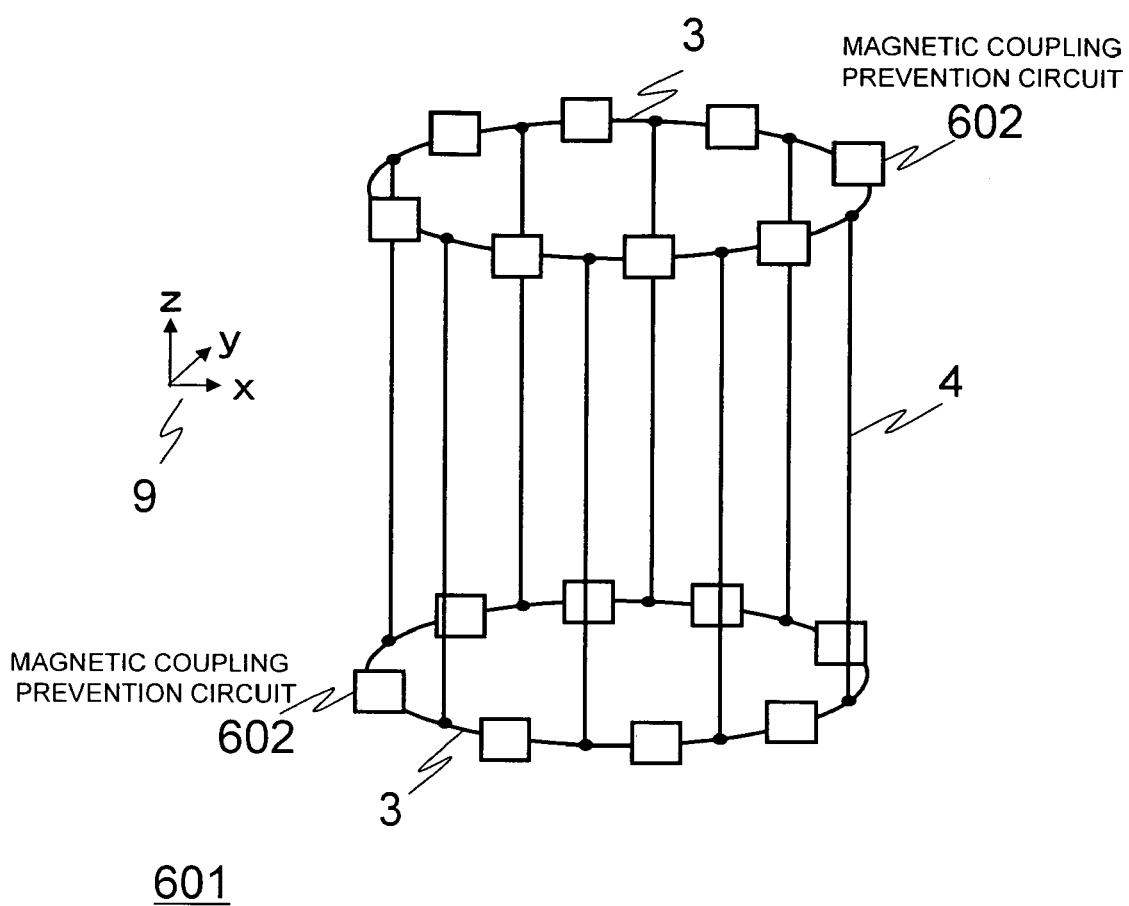

FIG. 15 shows a schematic view of a birdcage type RF coil according to the third embodiment.

Figure 16A:
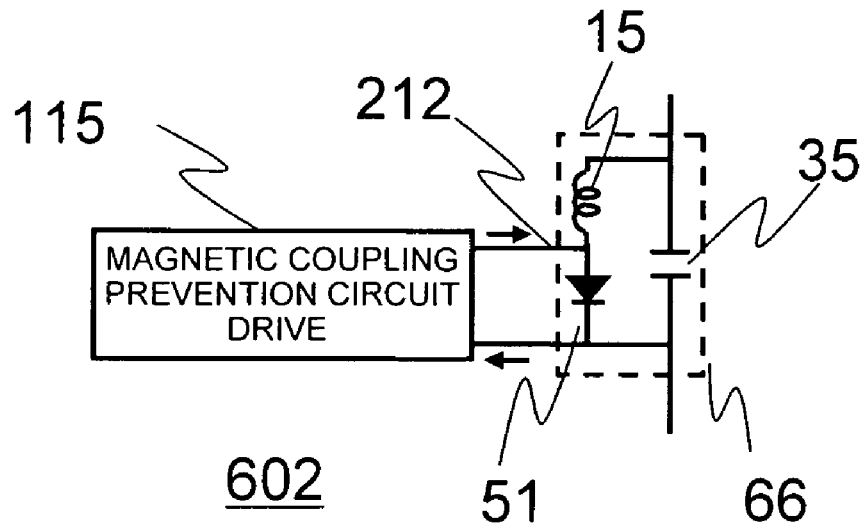
Figure 16B:
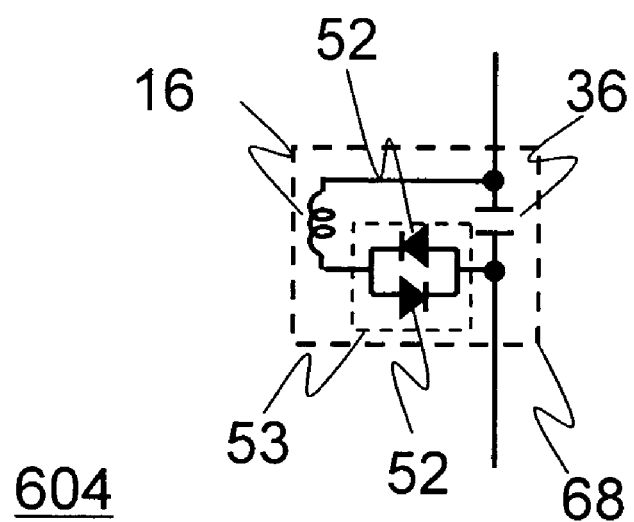

FIG. 16A and FIG. 16B are schematic diagrams of a magnetic coupling prevention circuit used in the third embodiment.

Figure 17:
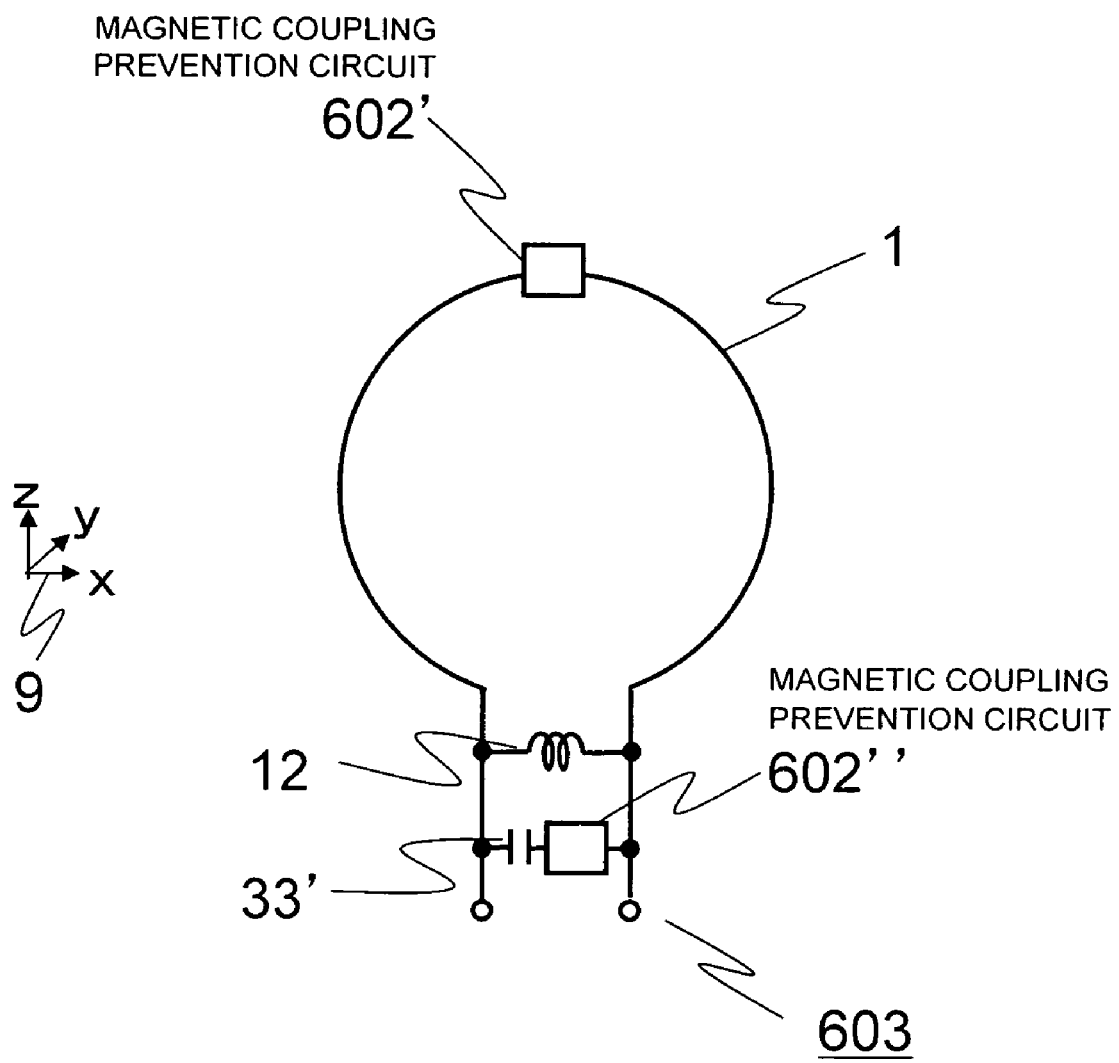

FIG. 17 shows a schematic view of a loop coil according to the third embodiment.

Figure 18:
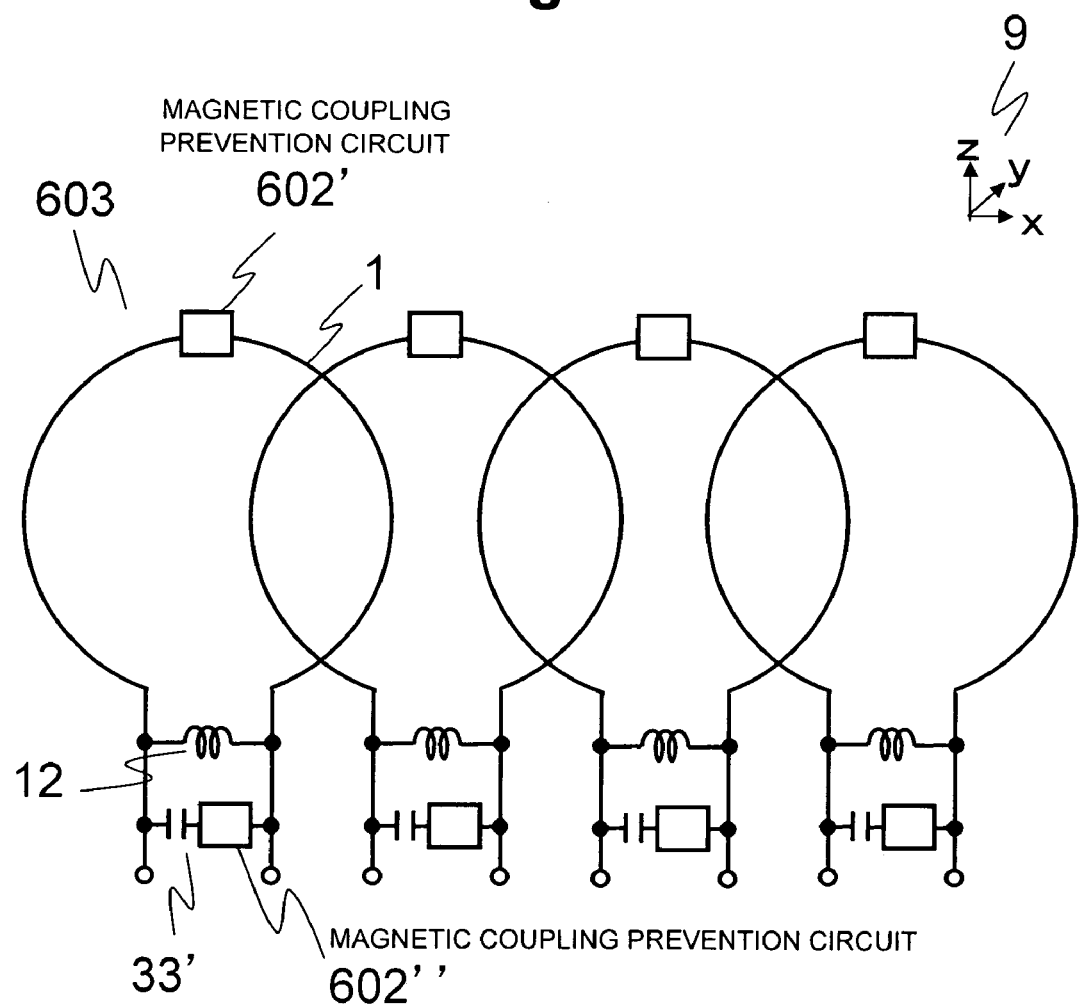

FIG. 18 shows a schematic view of an array coil according to the third embodiment.

Figure 19:
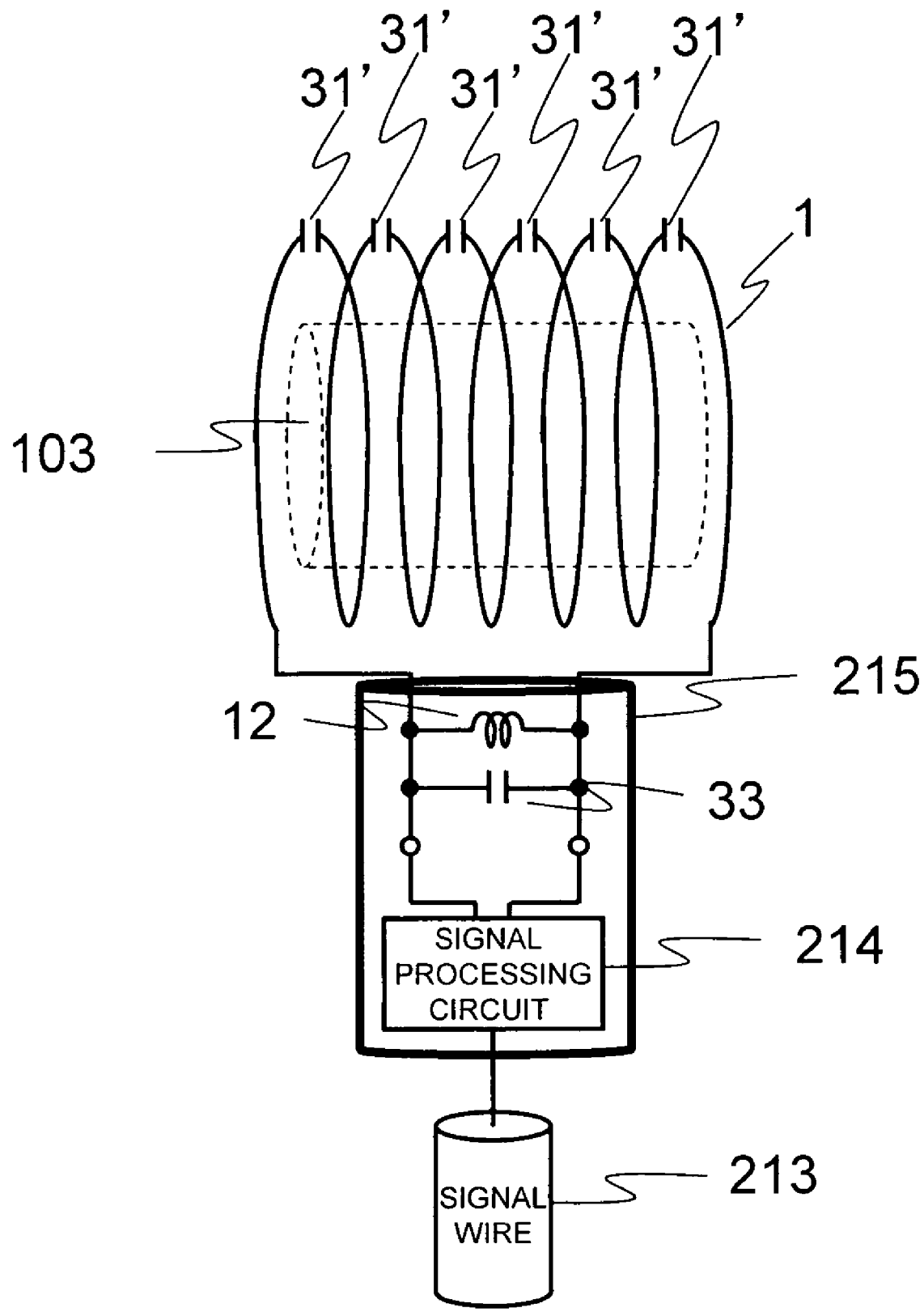

FIG. 19 shows a schematic view of a solenoid coil according to the first embodiment attached with a radio shielding.

Figure 20A:
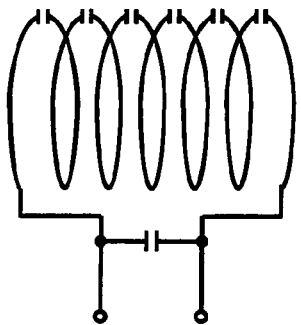

FIG. 20A shows a schematic view showing configuration of a conventional RF coil.

Figure 20B:
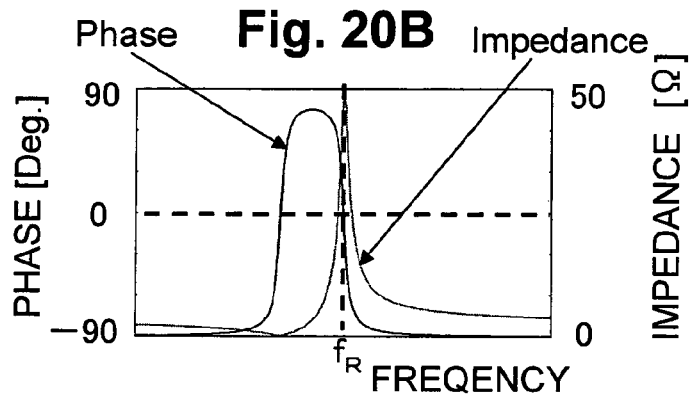
Figure 20C:
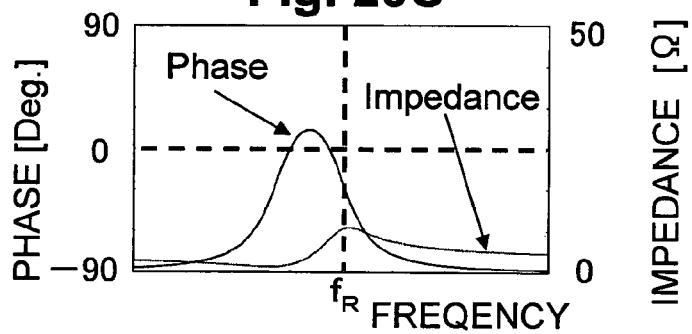
Figure 20D:
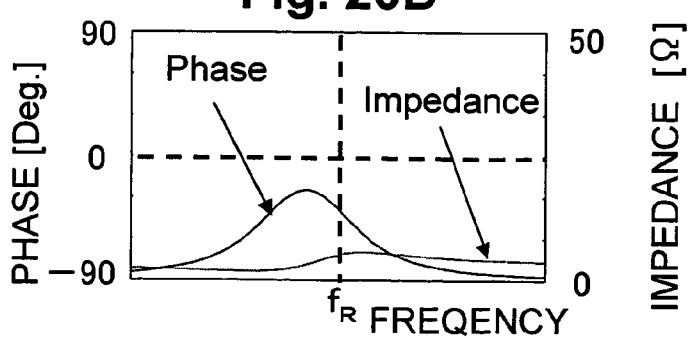

FIG. 20B, FIG. 20C, and FIG. 20D show frequency characteristics of phase and impedance of the conventional RF coil.

DETAILED DESCRIPTION OF THE INVENTION

First Embodiment

Figure 1A:
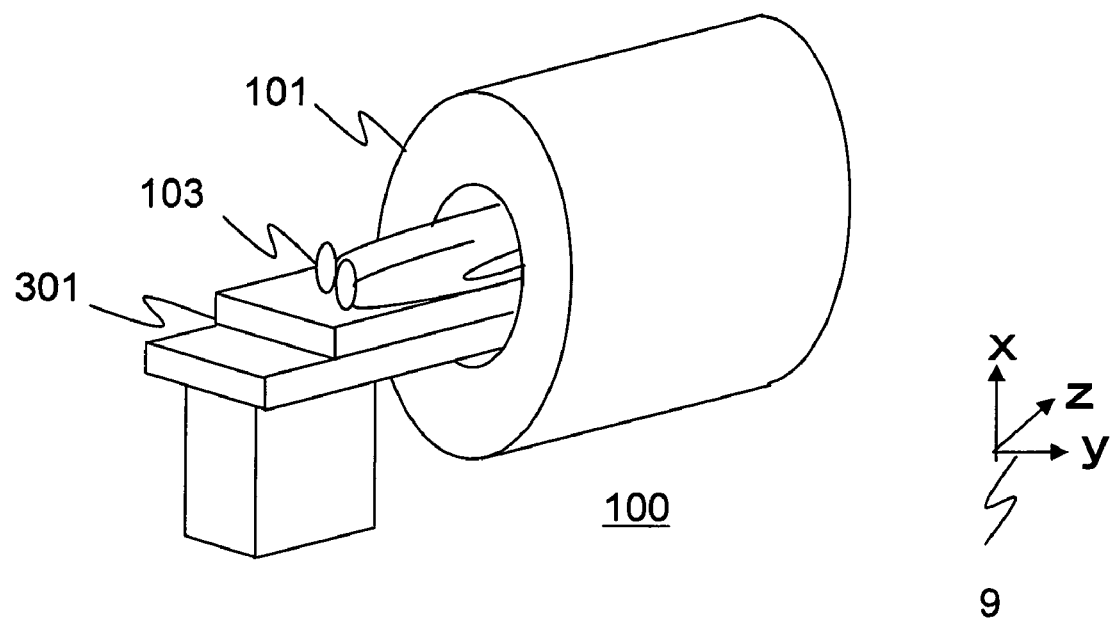
FIG. 1A is a schematic view of an MRI apparatus according to the first embodiment, which comprises a horizontal magnetic field type magnet.
Figure 1B:
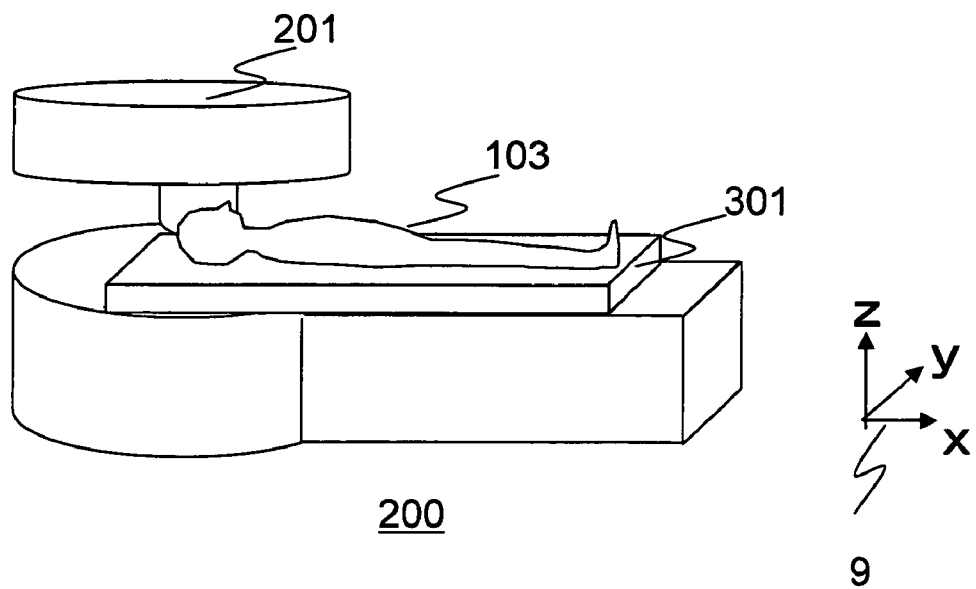
FIG. 1B is a schematic view of an MRI apparatus according to the first embodiment, which comprises a vertical magnetic field type magnet.

The first embodiment of the present invention will be explained below. Total configuration of an MRI apparatus of this embodiment is explained first. FIG. 1A and FIG. 1B include schematic views of MRI apparatuses of this embodiment. In the diagram, the direction of the z-axis of the coordinate 9 is the direction of static magnetic field. An MRI apparatus 100 shown in FIG. 1A is provided with a horizontal magnetic field type magnet 101. An MRI apparatus 200 shown in FIG. 1B is provided with a vertical magnetic field type magnet 201. These MRI apparatuses 100 and 200 are provided with a table 301 on which a test subject 103 is placed. This embodiment can be applied to both the MRI apparatus 100 provided with the horizontal magnetic field type magnet 101, and the MRI apparatus 200 provided with the vertical magnetic field type magnet 201. This embodiment will be explained below by referring to the MRI apparatus 100 having the horizontal magnetic field type magnet 101 as an example.

Figure 2:
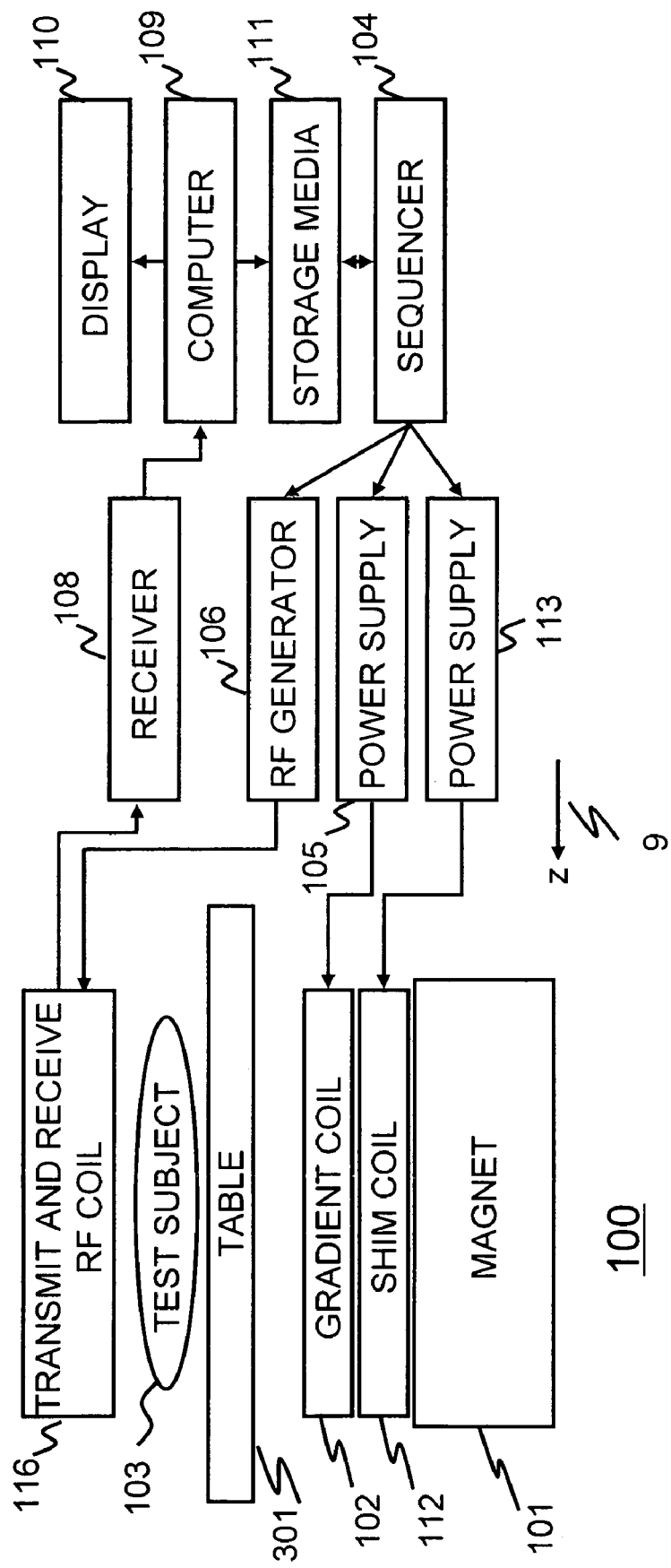
FIG. 2 shows a block diagram of an MRI apparatus according to the first embodiment.

FIG. 2 is a block diagram showing a schematic configuration of the MRI apparatus 100. As shown in this diagram, the MRI apparatus 100 is provided with the horizontal magnetic field type magnet 101, a gradient coil 102 which generates a gradient magnetic field, a sequencer 104, a transmit and receive RF coil 116 which generates an RF magnetic field and receives RF magnetic field signals generated by the test subject 103. The gradient coil 102 is connected to the gradient magnetic field power supply 105. The transmit and receive RF coil 116 is connected to the RF generator (synthesizer) 106 and a receiver 108. The sequencer 104 sends commands to the gradient magnetic field power supply 105 and the RF generator 106, and makes them generate a gradient magnetic field and an RF magnetic field, respectively. RF signals are applied to the test subject 103 via an RF magnetic field by the transmit and receive RF coil 116. The magnetic resonance (RF) signals generated from the test subject 103 as a result of application of the RF magnetic field are detected by the transmit and receive RF coil 116, and detection is performed by the receiver 108. A magnetic resonance frequency as the basis of the detection in the receiver 108 is set by the sequencer 104. The detected signals are sent to a computer 109 via an A/D converter, and signal processing such as image reconstruction is performed in the computer. The results are displayed on a display 110. The detected signals and measurement conditions are stored in storage media 111 as required. The sequencer 104 controls operations of the devices so that the gradient magnetic field and the radio frequency magnetic field should be generated at timing and intensity programmed beforehand. Furthermore, when adjustment of uniformity of the static magnetic field is required, a shim coil 112 is used. In addition, as the aforementioned transmit and receive RF coil 116, a transmit coil which generates an RF magnetic field and a receive coil which receives signals from the subject 103 may be separately provided, or one coil serving as the both may be used. In the following explanation of this embodiment, a case of using one coil serving as the both will be explained as an example.

In this embodiment, the RF coil 116 is constituted so that change of phase at a nuclear magnetic resonance frequency of nuclei to be detected should be within a range acceptable for maintenance of detection efficiency even if loss is caused in the RF coil 116 due to load within an expected range such as that of a test subject, or test subject is changed.

The configuration of the transmit and receive RF coil 116 of this embodiment will be explained. FIG. 3 shows a schematic view of a solenoid coil 540 used as the transmit and receive RF coil 116 of this embodiment. In the diagram, the z-axis direction of the coordinate 9 is the direction of the static magnetic field. The solenoid coil 540 of this embodiment is provided with a series resonant circuit 61 having a solenoid coil made of a conductor 1 inserted with six capacitors 31' in series, an inductor 12 having a value of $L_B$, a capacitor 33 having a value of $C_C$ and a signal processing circuit 214.

In the solenoid coil 540, the series resonant circuit 61, the inductor 12, and the capacitor 33 are connected in parallel, and the signal processing circuit 214 is connected to the capacitor 33 in parallel. Further, the solenoid coil 540 is connected to the RF generator 106 and the receiver 108 via the signal processing circuit 214. The signal processing circuit 214 has circuits for processing signals such as a balun, an impedance matching circuit and a pre-amplifier.

Although the solenoid coil 540 in which the number of the capacitors 311 inserted is 6 is mentioned here as an example, the number may be changed depending on magnitude of inductance of the solenoid coil made of the conductor 1.

Figure 4A:
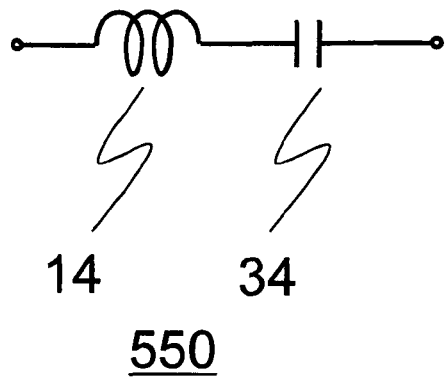
Figure 4B:
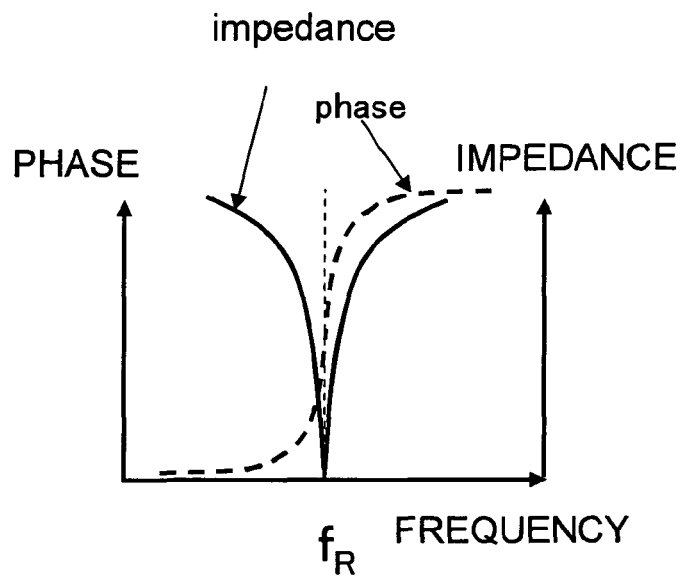

Operations of general series resonant circuit and parallel resonant circuit will be explained. First, operation of a series resonant circuit will be explained. FIG. 4A and FIG. 4B are diagrams for explaining operation of a series resonant circuit. As shown in FIG. 4A, in the series resonant circuit 550, an inductor 14 having a value of L and a capacitor 34 having a value of C are connected in series. When frequency of voltage to be fed is represented by f, and angular frequency is represented by ω (ω=2πf), impedance Z between the both ends of the series resonant circuit 550 is represented by the equation (1).

$$Z = j\omega L + \frac{1}{j\omega C} = j2\pi fL + \frac{1}{j2\pi fC} \quad (1)$$

FIG. 4B is a diagram for explaining the frequency characteristic of the series resonant circuit 550. The impedance Z of the series resonant circuit 550 changes depending on the frequency f as shown in FIG. 4B. At a frequency f=$f_R$, impedance Z becomes 0, and the series resonant circuit 550 resonates. Further, as shown in FIG. 4B, the series resonant circuit 550 operates as inductive reactance in the region of frequency higher than a frequency at which it resonates, i.e., the resonance frequency $f_R$ ($f_R$<f). The impedance Z in such a case is represented by the equation (2).

$$Z = j2\pi fL\frac{(f/f_R)^2 - 1}{(f/f_R)^2} \quad (2)$$

Value L' of apparent inductance of the series resonant circuit 550 is represented by the equation (3) in this case.

$$L' = \frac{(f/f_R)^2 - 1}{(f/f_R)^2}L \quad (3)$$

On the other hand, in the region of frequency lower than the resonance frequency $f_R$ of the series resonant circuit 550 (f<$f_R$), the series resonant circuit 550 operates as capacitative reactance. The impedance Z is represented by the equation (4) in this case.

$$Z = \frac{1 - (f/f_R)^2}{j2\pi fC} \quad (4)$$

Value C' of the apparent capacitance of the series resonant circuit 550 is represented by the equation (5) in this case.

$$C' \frac{C}{1 - (f/f_R)^2} \quad (5)$$

The phase also changes depending on the frequency f as shown in FIG. 4B. Considering on the current basis, during the operation as inductive reactance, the phase of voltage leads the phase of current by 90 degrees. And, during the operation as capacitative reactance, the phase of voltage lags behind the phase of current by 90 degrees. At the resonance frequency $f_R$, at which the circuit does not operate as any of them, the phase of voltage does not lag behind nor lead, and phase difference of the both, i.e., the phase becomes 0 degree.

As described above, the series resonant circuit 550 differently operates depending on the frequency of voltage. Specifically, in the frequency region higher than $f_R$, it operates as inductive reactance so that the phase of voltage leads by 90 degrees. And in the frequency region lower than $f_R$, it operates as capacitative reactance so that the phase of voltage lags behind by 90 degrees.

Figure 4C:
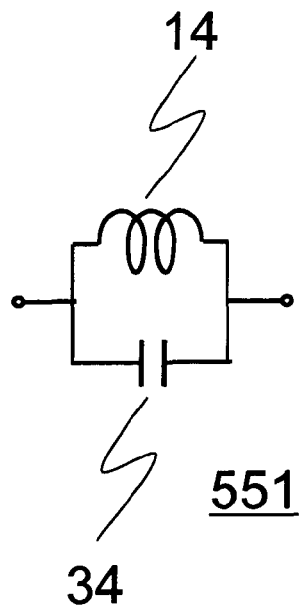
Figure 4D:
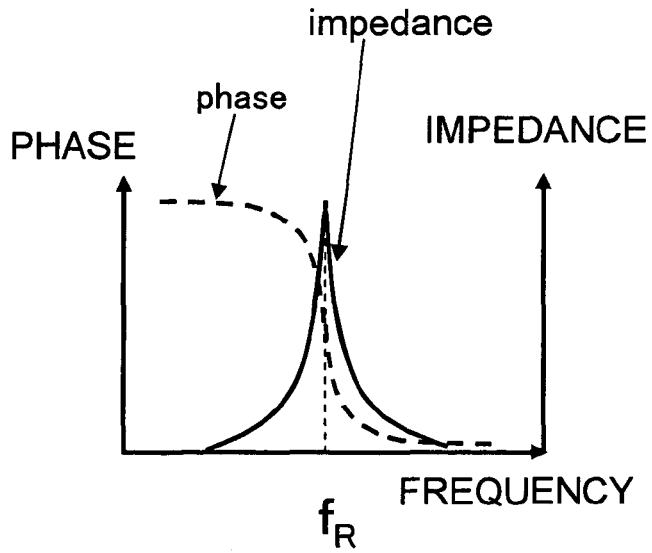

First, operation of a parallel resonant circuit will be explained. FIG. 4C and FIG. 4D are diagrams for explaining operation of a parallel resonant circuit. As shown in FIG. 4C, in the parallel resonant circuit 551, an inductor 14 having a value of L and a capacitor 34 having a value of C are connected in parallel.

FIG. 4D is a diagram for explaining the frequency characteristic of the series resonant circuit 551. The impedance Z changes depending on the frequency f as shown in FIG. 4D, and it resonates at a frequency f=$f_R$ (resonance frequency). The parallel resonant circuit 551 operates as capacitative reactance in a region of frequency higher than the resonance frequency $f_R$ ($f_R$<f). On the other hand, in a region of frequency lower than the resonance frequency $f_R$ of the parallel resonant circuit 551 (f<$f_R$), it operates as inductive reactance.

Further, the phase also changes depending on the frequency f as shown in FIG. 4D. Considering on the current basis, during the operation as inductive reactance, the phase of voltage leads the phase of current by 90 degrees. And during the operation as capacitative reactance, the phase of voltage lags behind the phase of current by 90 degrees, also in a parallel resonant circuit. At the resonance frequency $f_R$, at which the circuit does not operate as any of them, the phase of voltage does not lag behind nor lead, and phase difference of the both, i.e., the phase becomes 0 degree.

As described above, the parallel resonant circuit 551 differently operates depending on the frequency of voltage. Specifically, in the frequency region lower than $f_R$, it operates as inductive reactance so that the phase of voltage leads by 90 degrees. And in the frequency region higher than $f_R$, it operates as capacitative reactance so that the phase of voltage lags behind by 90 degrees.

Based on the operations of general series resonant circuit and parallel resonant circuit explained above, operation and characteristics of the solenoid coil 540 of this embodiment will be explained. Here, explanation will be made by referring to a schematic view showing simplified coil shape of the solenoid coil 540. FIG. 5A, FIG. 5B, and FIG. 5C are diagrams for explaining operation of the solenoid coil 540 using a schematic view thereof.

FIG. 5A is a schematic view showing simplified shape of the coil in the parallel circuit 545 of the solenoid coil 540 of this embodiment (see FIG. 3). The series resonant circuit 61 of the parallel circuit 545 according to this embodiment is represented by a circuit constituted by an inductor 21 having a value of $L_A$ and a capacitor 41 having a value of $C_A$ (series resonant circuit 61'). $L_A$ is a value of the inductance of the series resonant circuit 61 made of the conductor 1, and $C_A$ is a combined value for the six capacitors 31' inserted into the series resonant circuit 61. Therefore, the parallel circuit 545 of this embodiment is represented as a circuit 541 where the series resonant circuit 61', an inductor 12 having a value of $L_B$ and a capacitor 33 having a value of $C_C$ are connected in parallel.

Here, the resonance frequency of the series resonant circuit 61 (=61') is represented by $f_A$. When voltage of a frequency lower than the frequency $f_A$ is fed to the circuit 541, the series resonant circuit 61' operates as capacitative reactance (capacitor 44). The value of the capacitor 44 at this time is represented by $C_A'$. The apparent configuration of the circuit in this case is shown in FIG. 5B. As shown in this diagram, when voltage of a frequency lower than a frequency $f_A$ is fed, the circuit 541 is represented as a parallel resonant circuit 542 in which the capacitor 44, the inductor 12 and the capacitor 33 are connected in parallel. The resonance frequency of this parallel resonant circuit 542 is represented by $f_B$.

On the other hand, when voltage of a frequency higher than the frequency $f_A$ is fed to the circuit 541, the series resonant circuit 61' operates as inductive reactance (inductor 24). The value of the inductor 24 in this case is represented by $L_A'$. The apparent configuration of the circuit in this case is shown in FIG. 5C. As shown in this diagram, when voltage of a frequency higher than the frequency $f_A$ is fed, the circuit 541 is represented as a parallel resonant circuit 543 in which the inductor 24, the inductor 12 and the capacitor 33 are connected in parallel. The resonance frequency of this parallel circuit 543 is represented by $f_C$.

As described above, when voltage of a frequency lower than the resonance frequency $f_A$ of the series resonant circuit 61 (=61') is fed, the parallel circuit 545 of this embodiment operates as a parallel resonant circuit 542, and has the resonance frequency $f_B$ (first parallel resonance frequency). Further, when voltage of a frequency higher than the frequency $f_A$ is fed, it operates as a parallel resonant circuit 543, and has the resonance frequency $f_C$ (second parallel resonance frequency).

Therefore, this parallel circuit 545 shows the frequency characteristic around the frequency $f_R$ (=$f_B$) shown in FIG. 4D around the first parallel resonance frequency $f_B$, and shows the frequency characteristic around the frequency $f_R$ (=$f_C$) shown in FIG. 4D around the second parallel resonance frequency $f_C$. Further, around the resonance frequency $f_A$ of the series resonant circuit 61, it shows the frequency characteristic around the frequency $f_R$ (=$f_A$) shown in FIG. 4B. This parallel circuit 545 shows a frequency characteristic corresponding to combination of the frequency characteristics at the resonance frequencies $f_A$, $f_B$ and $f_C$. Since these resonance frequencies are in the relationship of $f_B < f_A < f_C$, this parallel circuit 545 shows the frequency characteristic shown in FIG. 6A.

The solenoid coil 540 of this embodiment is constituted with this parallel circuit 545. Therefore, the solenoid coil 540 of this embodiment also shows the frequency characteristic shown in FIG. 6A. In this embodiment, the values of the inductor and the capacitor are adjusted so that the solenoid coil 540 (parallel circuit 545) as a whole should resonate at the resonance frequency $f_A$ of the series resonant circuit 61, and the resonance frequency $f_A$ should be the nuclear magnetic resonance frequency $f_0$ of the nuclei to be detected. That is, the solenoid coil 540 has at least three different resonance frequencies, and the values of the inductor and the capacitor are adjusted so that one of the resonance frequencies should be the nuclear magnetic resonance frequency $f_0$ of the nuclei to be detected.

In this embodiment, the values of the inductor and the capacitor are adjusted so that the resonance frequencies $f_A$, $f_B$ and $f_C$ should satisfy the following equation (6).

$$\frac{f_A - f_B}{f_C - f_A} = 1 \qquad (6)$$

The values of the inductor and the capacitor are adjusted so that the first parallel resonance frequency $f_B$ and the second parallel resonance frequency $f_C$ should locate on both sides of the resonance frequency $f_A$ with the same distances from $f_A$ on the frequency axis in the graph shown in FIG. 6A.

Phase changing manner in case that load is included in the coil of the solenoid coil 540 of this embodiment adjusted as described above so that loss is caused in the coil is shown in FIG. 6B. As shown in the diagram, the solenoid coil 540 of this embodiment shows frequency characteristic curve for the phase rotationally symmetrical with respect to the point at which the phase at a frequency $f_A$ is 0 degree in the region between the frequencies $f_B$ and $f_C$ for the nuclear magnetic resonance frequency $f_0$ (=$f_A$) of the nuclei to be detected, and therefore the phase change between $f_B$ and $f_A$ and the phase change between $f_A$ and $f_C$ can be balanced. Accordingly, even if loss is caused and phase change becomes moderate, a state that the phase is 0 around the nuclear magnetic resonance frequency $f_0$ is maintained. Therefore, the solenoid coil 540 of this embodiment can efficiently detect signals at the magnetic resonance frequency $f_0$, even if degree of loss caused in the RF coil changes.

As explained above, the circuit of the solenoid coil 540 of this embodiment is constituted so that it should resonate at the nuclear magnetic resonance frequency $f_0$ (=$f_A$) of the nuclei to be detected, and it should resonate also at the frequency $f_B$ lower than the frequency $f_A$ and the frequency $f_C$ higher than the frequency $f_A$. Furthermore, the values of the inductor and the capacitor are adjusted so that the resonance frequencies $f_A$, $f_B$ and $f_C$ should satisfy the equation (6). Therefore, the RF coil 116 of this embodiment provided with such a solenoid coil 540 can efficiently detect signals at the nuclear magnetic resonance frequency $f_0$ of the nuclei to be detected, even if significant loss is caused, or test subject is changed.

Although this embodiment has been explained by referring to a case where transmission and reception are attained with one coil as an example, the RF coil 116 of this embodiment may also be used as a receive-only coil. When it is used as a receive-only coil, even if slight impedance mismatching is caused, signals can be detected. Therefore, if the impedance is adjusted beforehand to about 50Ω corresponding to usual imaging objects, signals can be efficiently detected without adjustment of the capacity of the capacitor even in case that load changes, even if any impedance matching circuit is not included.

The coil of the RF coil 116 of this embodiment has a solenoid shape. Therefore, as shown in FIG. 3, by placing a test subject 103 such as arm, leg and trunk of a test body in a solenoid coil, magnetic resonance signals can be detected with high sensitivity from a deep region of the test subject 103 in addition to the surface of the test subject 103.

Hereafter, it will be explained that the value $L_B$ of the inductor 12 and the value $C_C$ of the capacitor 33 of the solenoid coil 540 of this embodiment can be set within practical ranges, together with the calculation method thereof.

The value $C_A'$ of the capacitor 44 of the parallel resonant circuit 542 is represented by the following equation (7), which corresponds to the equation (5) where $f_R$ is replaced with $f_A$.

$$C'_A = \frac{C_A}{1-(f/f_A)^2} \quad (7)$$

A resonance frequency $f_{OP}$, a value L of an inductor and a value C of a capacitor of a parallel resonant circuit provided with the inductor and the capacitor are generally in the following relationship represented by the following equation (8).

$$f_{OP} = \frac{1}{2\pi\sqrt{LC}} \quad (8)$$

When the parallel resonant circuit 542 is adjusted so that it should resonate at the first parallel resonance frequency $f_B$, the resonance frequency of the parallel resonant circuit 542 is the first parallel resonance frequency $f_B$. Therefore, $f_B$, the values $C_A'$ and $C_C$ of the capacitors 44 and 33 and the value $L_B$ of the inductor 12 satisfy the equation 8. Accordingly, the relation of $f_B$, $C_A'$, $C_C$ and $L_B$ is represented by the equation (9).

$$f_B = \frac{1}{2\pi\sqrt{L_B(C'_A + C_C)}} \quad (9)$$

When the equation (7) and the equation (9) are solved for $L_B$, the value $L_B$ of the inductor 12 is represented by the following equation (10).

$$L_B = \frac{1}{\dfrac{C_A}{1-(f_B/f_A)^2} + C_C} \frac{1}{(2\pi f_B)^2} \quad (10)$$

The value $L_A'$ of the inductor 24 of the parallel resonant circuit 543 is represented by the following equation (11), which corresponds to the equation (3) where $f_R$ is replaced with $f_A$.

$$L'_A = \frac{(f/f_A)^2 - 1}{(f/f_A)^2} L_A \quad (11)$$

When the parallel resonant circuit 543 is adjusted so that it should resonate at the second parallel resonance frequency $f_C$, the resonance frequency of the parallel resonant circuit 543 is the second parallel resonance frequency $f_C$. Therefore, $f_C$, the values $L_A'$ and $L_C$ of the inductors 24 and 12 and the value $C_C$ of the capacitor 33 satisfy the equation (8). Accordingly, the relation of $f_C$, $L_A'$, $L_B$ and $C_C$ is represented by the equation (12).

$$f_C = \frac{1}{2\pi}\sqrt{\frac{L'^{-1}_A + L^{-1}_B}{C_C}} \quad (12)$$

When the equation (11) and the equation (12) are solved for $C_C$, the value $C_C$ of the capacitor 33 is represented by the following equation (13).

$$C_C = \left(\frac{(f_C/f_A)^2}{(f_C/f_A)-1}\frac{1}{L_A} + \frac{1}{L_B}\right)\frac{1}{(2\pi f_C)^2} \quad (13)$$

From the above, the value $L_B$ of the inductor 12 and the value $C_C$ of the capacitor 33 are represented by the equations (14) and (15), respectively, using the resonance frequencies $f_A$, $f_B$ and $f_C$, as well as $L_A$ and $C_A$.

$$L_B = \frac{(2\pi f_C)^2 - (2\pi f_B)^2}{(2\pi f_C)^2(2\pi f_B)^2\left(\dfrac{C_A}{1-f_B/f_A} + \dfrac{(f_C/f_A)^2}{(f_C/f_A)^2-1}\dfrac{1}{L_A(2\pi f_C)^2}\right)} \quad (14)$$

$$C_C = \frac{\dfrac{(f_C/f_A)^2}{(f_C/f_A)^2-1}\dfrac{1}{L_A} + \dfrac{(2\pi f_B)^2 C_A}{1-(f_B/f_A)^2}}{(2\pi f_C)^2 - (2\pi f_B)^2} \quad (15)$$

Then, the value $L_B$ of the inductor 12 and the value $C_C$ of the capacitor 33 of the solenoid coil 540 are specifically calculated by using the aforementioned relationships. Here, explanation is made for a case that the solenoid coil 540 is adjusted so as to be able to transmit and receive signals of 300 MHz, which is the nuclear magnetic resonance frequency of hydrogen nuclei at 7 Tesla, as an example. That is, the resonance frequency $f_A$ of the series resonant circuit 61 is set to be 300 MHz. Further, in this embodiment, a solenoid coil of six turns having a diameter of 65 mm and an axial length of 140 mm, which is usually used for MRI apparatuses, is used as the solenoid coil 540 as an example. The value of the inductance of this solenoid coil is 1.5 μH. Further, number of the capacitors inserted into the loop portion is 26 as an example.

The value $L_A$ of the inductor 21 of the series resonant circuit 61 (61') is 1.5 μH, which is the value of the inductance of the aforementioned solenoid coil. Then, $C_A$, which is a combined value of the capacitor of the series resonant circuit 61 (61'), is determined. A resonance frequency $f_{os}$, a value L of an inductor, and a value C of a capacitor in a series resonant circuit are generally in the relationship represented by the following equation (16).

$$f_{os} = \frac{1}{2\pi\sqrt{LC}} \quad (16)$$

In the series resonant circuit 61 (61'), $f_{os}$ is $f_A$ (=300 MHz) and L (=$L_A$) is 1.5 μH, and therefore the combined value $C_A$ of the capacitor can be calculated to be 0.19 pF in accordance with the equation 16. Therefore, the values of 26 of capacitors 31' constituting the series resonant circuit 61 are 4.9 pF, respectively.

Then, the resonance frequencies $f_B$ and $f_C$ are determined. Here, they are determined so that the value $L_B$ of the inductor 12 determined in accordance with the equation (14) should be 10 to 200 nH, and the value $C_C$ of the capacitor 33 determined in accordance with the equation (15) should be 2 to 200 pF. This is for making RF loss of the inductor 12 and the capacitor 33 constituting each low, and making actual production and adjustment easy.

Figure 7A:
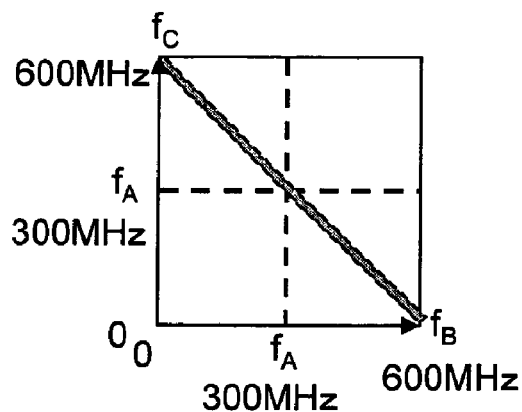
Figure 7B:
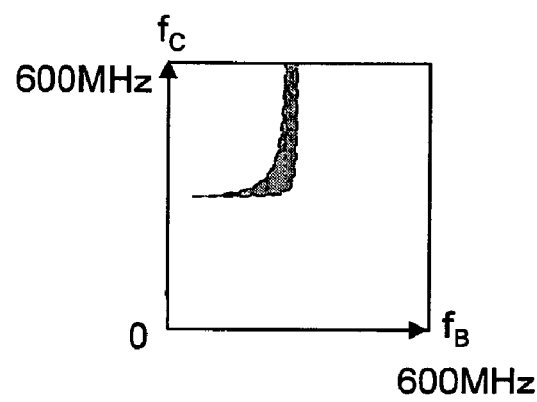
Figure 7C:
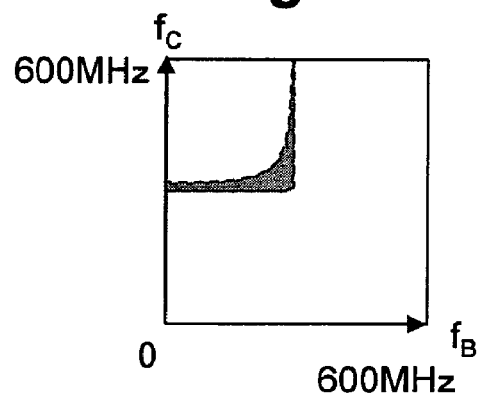
Figure 7D:
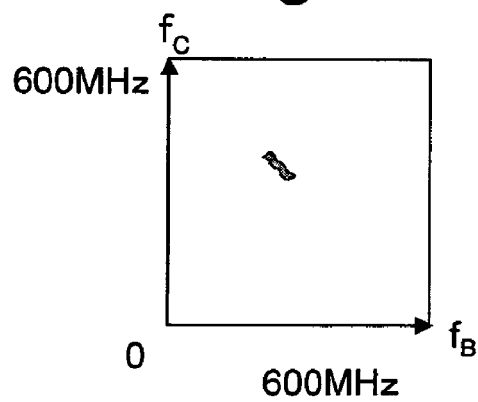

The frequency region of $f_B$ and $f_C$ where they satisfy the equation (6) is shown in FIG. 7A. In this graph, the horizontal axis represents $f_B$, and the vertical axis represents $f_C$. The same shall apply to FIGS. 7B, 7C, 7D, and 7E. The frequency region of $f_B$ and $f_C$ where the value $L_B$ of the inductor 12 determined in accordance the equation (14) should be 10 to 200 nH is shown in FIG. 7B. Similarly, the frequency region of $f_B$ and $f_C$ where the aforementioned value $C_C$ of the capacitor 33 determined in accordance the equation (15) should be 2 to 200 pF is shown in FIG. 7C. Further, the frequency region of $f_B$ and $f_C$ satisfying all the requirements shown in FIG. 7A, FIG. 7B, and FIG. 7C is shown in FIG. 7D. From those in this region, $f_B$ and $f_C$ satisfying the relationship of $f_B < f_A < f_C$ are chosen. For example, a combination of the resonance frequency $f_B$ of 285 MHz and the resonance frequency $f_C$ of 315 MHz is selected.

By using the resonance frequencies $f_A$, $f_B$, $f_C$, the value $L_A$ of the inductor 21 and the value $C_A$ of the capacitor 41 determined as described above, the value $L_B$ of the inductor 12 and the value $C_C$ of the capacitor 33 are calculated to be 15.1 nH and 18.8 pF, respectively, in accordance with the equations (14) and (15).

From the above, by adjusting $L_A$, $L_B$, $C_A$ and $C_C$ to 1.5 µH, 15.1 nH, 0.187 pF and 18.8 pF, respectively, the solenoid coil 540 of this embodiment should have the frequency characteristic shown in FIG. 6A. In this case, $f_A$ in FIG. 6A is the nuclear magnetic resonance frequency of hydrogen nuclei at 7 T, 300 MHz, and $f_B$ and $f_C$ are 285 and 315 MHz, respectively.

Hereafter, results of simulation for change of frequency characteristic observed when load is added to the RF coil of this embodiment and an RF coil of conventional type will be shown. FIG. 8A, FIG. 8B, and FIG. 8C shows results of the simulation obtained by adding load to the RF coil of this embodiment and an RF coil of conventional type. The RF coils used for the simulation were an RF coil provided with the solenoid coil 540 of this embodiment and the RF coil of conventional type shown in FIG. 20A. As the solenoid coil of conventional type, a solenoid coil of six turns having a diameter of 65 mm and an axial length of 140 mm, the same as that used for this example, was used. Further, 26 capacitors were inserted into the coil as in this example.

FIG. 8A shows the frequency characteristics of phase and impedance of the RF coils of this embodiment and conventional type. Here, the detection objects were magnetic resonance signals of hydrogen nuclei at 7 T. That is, $f_A$ was 300 MHz. Further, the resonance frequencies $f_B$ and $f_C$ were adjusted to be 285 MHz and 315 MHz, respectively. Further, impedance was adjusted so that it should be 50Ω at the magnetic resonance frequency $f_0$. As a result, the RF coil of this embodiment could efficiently consume electric power, and could detect desired magnetic resonance signals.

FIG. 8B shows change of the frequency characteristic of phase of the RF coil of this embodiment observed when magnitude of the load was changed. As shown in this diagram, change of the phase became milder as the load became larger. However, the phase at $f_A$ remained at about 0 degree. This is because the equation (6) was satisfied, and thus change of the phase between $f_B$ and $f_A$ and change of the phase between $f_A$ and $f_C$ were balanced.

FIG. 8C shows change of the frequency characteristic of phase of the RF coil of conventional type observed when magnitude of the load was changed. As shown in this diagram, change of the phase became milder when load was added, and therefore the phase did not become 0 degree at the nuclear magnetic resonance frequency of hydrogen nuclei at 7 T. Furthermore, since change of the phase became further milder as the load became larger, the phase at the nuclear magnetic resonance frequency of hydrogen nuclei further deviated from 0 degree. That is, in the RF coil constituted in a conventional manner, not only the phase did not become 0 degree, but also efficiency was degraded as the load became larger.

From the results of the above simulation, it was confirmed that the RF coil of this embodiment could make the phase 0 degree at a nuclear magnetic resonance frequency of desired atomic nuclei even when load was large, unlike the RF coil of the conventional type, as described above. Further, it was also confirmed that, by such adjustment that the equation (6) should be satisfied, the phase at $f_A$ could be maintained at substantially 0 degree, even magnitude of the load changed.

In the aforementioned embodiment, the explanation has been made by referring to an example in which the impedance is adjusted by using the impedance matching circuit in the signal processing circuit 214 as an example. However, the impedance can also be adjusted by changing the frequency difference of $f_A$ and $f_C$, and the frequency difference of $f_A$ and $f_B$ within the region shown in FIG. 7D.

In this embodiment, the adjustment is performed so that the three kinds of resonance frequencies $f_A$, $f_B$ and $f_C$ of the circuit 545 in the solenoid coil 540 should satisfy the equation (6). However, the adjustment is not limited to such an adjustment. In the design of an RF coil, it is usually adjusted so that when loss is caused due to load around that of a test subject, the phase of the detection object at the magnetic resonance frequency should be within ±30 degrees. Therefore, also in the solenoid coil 540 of this embodiment, it is sufficient that adjustment can be performed so that change of the phase should be within ±30 degrees. Specifically, if the adjustment is performed so that the three resonance frequencies $f_A$, $f_B$ and $f_C$ should satisfy the following equations (17), change of the phase at the magnetic resonance frequency of the detection object should be within ±30 degrees, even if magnitude of the loss changes, and thus acceptable for practical use.

$$0.5 < \frac{f_A - f_B}{f_C - f_A} < 2.0 \tag{17}$$

Figure 7E:
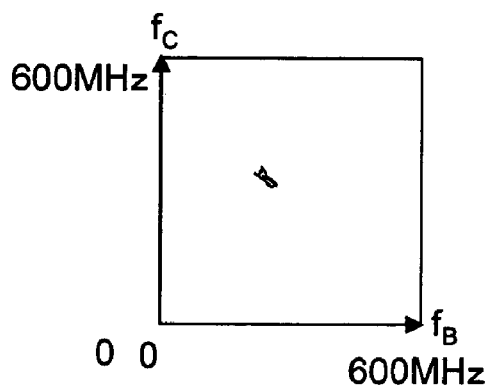

The frequency region of $f_B$ and $f_C$ in such a case is shown in FIG. 7E.

The above explanation has been made for the case where the nuclear magnetic resonance frequency $f_0$ is the nuclear magnetic resonance frequency of hydrogen nuclei as an example. However, the present invention is not limited to such a case.

Further, the shape of the solenoid-coil 540 of this embodiment is not limited to the aforementioned shape. Any coil shape of which schematically represented simplified shape is equivalent to that of the circuit 541 may be used. Hereafter, several examples will be explained.

<Modification 1: Saddle Type>

For example, the solenoid coil 540 may have a shape of saddle coil. A saddle coil 560, which is a modification of the solenoid coil 540 of this embodiment, is shown in FIG. 9. In the diagram, the z-axis direction of the coordinate 9 is the direction of the static magnetic field. Parts having the same functions as those of the solenoid coil 540 shown in FIG. 3 are indicated with the same numerals. As shown in this diagram, the saddle coil 560 is connected so that two facing loops of the saddle shape loop coil (saddle coil 560) should generate magnetic fields of the same direction, and it has such a shape that planes of the loops should curve along a side of cylinder.

Since the coil portion of the saddle coil 560 has a saddle shape, a test subject 103 such as arm, leg or trunk of a test body can be placed in the saddle coil as shown in FIG. 9. Therefore, magnetic resonance signals from a deep region of the test subject 103 can be detected with high sensitivity in addition to those from the surface thereof. Further, since the axial direction of the coil and the direction of the static magnetic field are parallel to each other when the saddle coil 560 is used, unlike the case where the solenoid coil 540 is used, use of such a saddle coil in an MRI apparatus 510 provided with a horizontal magnetic field type magnet 101 or the like provides easy operation of the apparatus.

<Modification 2: Surface Coil Type>

For example, the solenoid coil 540 may have a shape of surface coil. A surface coil 570, which is a modification of the solenoid coil of this embodiment, is shown in FIG. 10. In the diagram, the z-axis direction of the coordinate 9 is the direction of the static magnetic field. Parts having the same functions as those of the solenoid coil 540 shown in FIG. 3 are indicated with the same numerals. By setting the conductor of the surface coil 570 in contact with a test object 103, magnetic resonance signals from a region around the contacting surface can be detected with high sensitivity.

<Modification 3: Butterfly Type>

The solenoid coil may also have, for example, a shape of butterfly coil. A butterfly coil 570, which is a modification of the solenoid coil of this embodiment, is shown in FIG. 11. In the diagram, the z-axis direction of the coordinate 9 is the direction of the static magnetic field. Parts having the same functions as those of the solenoid coil 540 shown in FIG. 3 are indicated with the same numerals. As shown in this diagram, the butterfly coil 580 has a shape in which two adjacent surface loops are connected so that they should generate magnetic fields in directions inverse to each other.

Since the coil portion of the butterfly coil 580 has a butterfly shape, a test subject 103 such as arm, leg or trunk of a test body is not placed in a closed space. However, by setting the test subject 103 over or under the butterfly coil, as shown in FIG. 11, magnetic resonance signals can be detected with high sensitivity from a deep region of the test subject 103.

Simplified coil shapes of the saddle coil 560, the surface coil 570 and the butterfly coil 580 are equivalent to the circuit 541 of which coil shape of the solenoid coil 540 is simplified. Therefore, the circuit configurations and the principle of operation thereof are the same as those of the solenoid coil 540. However, since the coil shapes are different from that of the aforementioned solenoid coil 540, the values of the inductor 21 and the capacitor 41, $L_A$ and $C_A$, in each coil are different from those of the solenoid coil 540. Therefore, $L_B$ and $C_C$ are calculated on the basis of the differences of $L_A$ and $C_A$.

The saddle coil 560, the surface coil 570 and the butterfly coil 580 have a circuit configuration equivalent to that of the aforementioned solenoid coil 540 of this embodiment. Therefore, by adjusting the values of the inductor 12 and the capacitor 33 so that three resonance frequencies $f_A$, $f_B$ and $f_C$ satisfy the equations (17), where the resonance frequency $f_A$ is the nuclear magnetic resonance frequency $f_0$ of atomic nuclei to be detected, magnetic resonance signals can be always received by them with high detection efficiency, even if significant loss is caused in the RF coil, or test subject is changed.

They are adjusted so that $f_A$, $f_B$ and $f_C$ should satisfy the equation (6), not the equations (17), i.e., difference of the frequencies $f_B$ and $f_A$ should be equal to difference of the frequencies $f_A$ and $f_C$, the phase is maintained to be 0 degree at the frequency $f_0$ even if the loss changes, and therefore magnetic resonance signals can always be received with high detection efficiency.

The saddle coil 560, the surface coil 570 and the butterfly coil 580 may also be a transmit and receive coil, or may be used as a receive-only coil. In particular, when it is used as a receive-only coil, signal can be detected even if mismatching arises somewhat in impedance. Therefore, if the impedance is adjusted beforehand to about 50Ω corresponding to usual imaging objects, signals can be efficiently detected without adjustment of the capacity of the capacitor even in case that load changes, even without any impedance matching circuit. Further, although one capacitor 31 is inserted into the conductor 1 in these modifications, a plurality of capacitors may also be inserted.

Second Embodiment

Hereafter, the second embodiment of the present invention will be explained. The MRI apparatus according to this embodiment is fundamentally the same as that of the first embodiment. However, in this embodiment, coils made of combination of two surface coils 570, which are modifications of the first embodiment, are used as the transmit and receive RF coil 116 for realizing quadrature detection (QD), which improves irradiation efficiency and reception sensitivity of the transmit and receive RF coil. Hereafter, configurations different from those of the first embodiment will be mainly explained.

FIG. 12A and FIG. 12B are diagrams for explaining a transmit and receive RF coil 590 of this embodiment. And FIG. 12A shows a schematic view of the transmit and receive RF coil 590. In the diagram, the z-axis direction of the coordinate 9 is the direction of the static magnetic field. As shown in this diagram, the transmit and receive RF coil 590 of this embodiment is provided with a first surface coil 62 and a second surface coil 63. Configuration of the surface coils 62 and 63 is the same as that of the surface coil 570, which is a modification of the first embodiment. In this diagram, parts having the same functions as those of the surface coil 570, which is a modification of the first embodiment, are indicated with the same numerals.

Also in this embodiment, each of the first surface coil 62 and the second surface coil 63 has three resonance frequencies $f_A$, $f_B$, and $f_C$, and the resonance frequency $f_A$ is adjusted so as to be equal to the nuclear magnetic resonance frequency $f_0$ of nuclei to be detected, as in the first embodiment. Further, the resonance frequencies $f_B$, $f_C$, value of the capacitor and value of the inductor are adjusted so that the equation (6) or equations (17) mentioned for the first embodiment should be satisfied.

The first surface coil 62 and the second surface coil 63 of the transmit and receive RF coil 590 of this embodiment are disposed so that the loop planes 622 and 632 of the surface coil portions 621 and 631 should be parallel to the z-axis. Further, the second surface coil 63 is disposed at a position defined by rotating the first surface coil 63 by 90 degrees around the z-axis as the rotation axis.

FIG. 12B is a view of the transmit and receive RF coil 590 of this embodiment from the direction of the static magnetic field (z-axis direction in the diagram). As shown in this diagram, in the transmit and receive RF coil 590 of this embodiment, the direction 623 of the magnetic field generated by the first surface coil 62, and the direction 633 of the magnetic field generated by the second surface coil 63 are perpendicular to each other. Therefore, the first surface coil 62 and the second surface coil 63 are not magnetically coupled, but operate independently as an RF coil for magnetic resonance signals.

FIG. 13 is a block diagram for explaining connection of the first surface coil 62 and the second surface coil 63 of the transmit and receive RF coil 590 of this embodiment to an RF generator 106 and a receiver 108. Output of the RF generator 106 is inputted into a divider 202, and divided into two. At this time, it is divided so that phases thereof should be perpendicular to each other. Each output is inputted into the port 624 of the first surface coil 62 and the port 634 of the second surface coil 63 via signal processing circuits 214. Further, outputs from two surface coils 62 and 63 are inputted into pre-amplifiers 203 through the signal processing circuits 214, respectively, and the outputs of the pre-amplifiers 203 are inputted into a synthesizer 205 via phase shifters 204. The output of the synthesizer 205 is inputted into the receiver 108.

Operation of the transmit and receive RF coil 590 of this embodiment will be explained below. If an RF signal of the frequency $f_0$ is transmitted by the RF generator 106, the signal is divided into two by the divider 202 so that phases thereof should be perpendicular to each other, and they are fed to the port 624 and the port 634 via the signal processing circuits 214, respectively. Since the first surface coil 62 and the second surface coil 63 are adjusted so that they should resonate at the frequency $f_0$, the fed RF signal of the frequency $f_0$ is irradiated as RF magnetic fields on a test subject 103. Since the phases of the RF magnetic fields irradiated by the first surface coil 62 and the second surface coil 63 are perpendicular to each other, a circularly polarized magnetic field of which center is the z-axis of the coordinates 9 is generated in the test subject 103 upon irradiation of the RF magnetic fields. As described above, the transmit and receive RF coil 590 of this embodiment realizes QD type transmission.

Since the first surface coil 62 and second surface coil 63 are adjusted so that they should resonate at the frequency $f_0$, they detect perpendicular signal components of magnetic resonance signals of the frequency $f_0$ generated by the test subject 103, respectively. The detected signal components are amplified by the pre-amplifiers 203, processed by the phase shifters 204, respectively, synthesized by the synthesizer 205 and sent to the receiver 108. As described above, the transmit and receive RF coil 590 of this embodiment realizes QD type reception.

As explained above, the transmit and receive RF coil 590 of this embodiment realizes QD, and therefore, besides that it provides the effect of the surface coil 570 of the first embodiment, it can efficiently irradiate an RF magnetic field on the test subject 103, and can detect magnetic resonance signals with higher sensitivity.

This embodiment has been explained by referring to an example in which two surface coils 570 of the first embodiment are combined. However, the RF coil which can realize QD is not limited to such an RF coil, an RF coil constituted so that magnetic fields generated by two coils should be perpendicular to each other may be used. For example, such an RF coil can also be constituted by disposing two saddle coils so that one should locates at a position defined by rotating the other by 90 degrees around the Z-axis as the rotation axis. Furthermore, such an RF coil can also be constituted by disposing a solenoid coil and a saddle coil so that directions of the cylindrical shapes thereof should be the same.

Third Embodiment

The third embodiment of the present invention will be explained below. The MRI apparatus according to this embodiment is fundamentally the same as that of the first embodiment. However, in this embodiment, a transmit RF coil and a receive RF coil are independently provided instead of the transmit and receive RF coil 116 of the first embodiment. Here, explanation will be made by referring to a case where a birdcage type RF coil having a birdcage shape is used as the transmit RF coil and a loop coil having a surface coil shape is used for the receive RF coil as an example. Hereafter, configurations different from those of the first embodiment will be mainly explained.

FIG. 14 shows a block diagram for explaining connection of an RF coil 600 of this embodiment to an RF generator 106 and a receiver 108. As shown in this diagram, the RF coil 600 of this embodiment is provided with a birdcage type RF coil 601 which is a transmit RF coil, and a surface coil 603 which is a receive RF coil. The birdcage type RF coil 601 of this embodiment is constituted with a circuit equivalent to that of a conventional RF coil, and it is adjusted so that it should resonate at a nuclear magnetic resonance frequency $f_0$ of nuclei to be detected. Further, the surface coil 603 of this embodiment is constituted by a surface coil 570 of the first embodiment. They have three resonance frequencies $f_A$, $f_B$ and $f_C$, and the resonance frequency $f_A$ is adjusted to be equal to the magnetic resonance frequency $f_0$. Further, the resonance frequencies $f_B$, $f_C$, value of the capacitor and value of the inductor are adjusted so that the equation (6) or equations (17) mentioned for the first embodiment should be satisfied.

The RF coil of this embodiment is further provided with a magnetic coupling prevention circuit 602 for preventing magnetic coupling of the birdcage type RF coil 601 and the surface coil 603, a magnetic coupling prevention circuit drive 115 for driving the magnetic coupling prevention circuit 602, and a divider 202 for distributing output of the RF generator 106. In this embodiment, the magnetic coupling prevention circuit 602 is inserted into each of the birdcage type RF coil 601, the loop portion of the surface coil 603 and the capacitor 33 in series. The birdcage type RF coil 601 and the surface coil 603 may have one or more magnetic coupling prevention circuits 602.

Output of the RF generator 106 which generates RF having the nuclear magnetic resonance frequency $f_0$ is inputted into the divider 202, and divided into two, and each output is inputted into a pickup coil 207 via a signal processing circuit 214. The pickup coil 207 is disposed so that the RF signal of the frequency $f_0$ should be transmitted to the birdcage type RF coil 601. A control signal wire 212 is connected from the magnetic coupling prevention circuit drive 115 to the magnetic coupling prevention circuit 602. When two or more magnetic coupling prevention circuits 602 are used, the control signal wire 212 is connected to each magnetic coupling prevention circuit 602. Further, the surface coil 603 is disposed inside the birdcage type RF coil 601 so that it should be at a position near a test subject 103. Output of the surface coil 603 is inputted into a pre-amplifier 203 via a signal processing circuit 214, and is inputted into a receiver 108 from the pre-amplifier 203. Further, multiple control signal wires 212 are connected to the magnetic coupling prevention circuit 602 from the magnetic coupling prevention circuit drive 115. When two or more magnetic coupling prevention circuits 602 are used, the control signal wire 212 is connected to each magnetic coupling prevention circuit 602.

FIG. 15 is a diagram for explaining the configuration and disposition of the birdcage type RF coil 601 of this embodiment. As shown in this diagram, in the birdcage type RF coil 601 of this embodiment, two loop conductors 3 are disposed so that they should face each other, each having a common axis perpendicular to the loop surfaces, and the loops are connected with multiple straight conductors 4 (8 straight conductors are used in FIG. 15 as an example) parallel to the axial direction of the loop conductors 3. Multiple magnetic coupling prevention circuits 602 are inserted in each of the loop conductors 3. Further, the birdcage type RF coil 601 is disposed so that the central axis of the cylindrical shape thereof should be parallel to the z-axis direction.

FIG. 16A is a diagram for explaining the configuration of the magnetic coupling prevention circuit 602 of this embodiment. As shown in this diagram, the magnetic coupling prevention circuit 602 of this embodiment is provided with a connection circuit having an inductor 15 and a PIN diode 51 connected in series, and a capacitor 35 connected to the connection circuit in parallel, and constitutes a parallel resonant circuit 66 having the capacitor 35 and the inductor 15. The PIN diode 51 has a characteristic that it becomes substantially conductive when a direct current which flows in the diode along the forward direction exceeds a certain amount, and ON/OFF of the diode is controlled with a direct current. Further, the output terminals of the magnetic coupling prevention circuit drive 115 are connected to the both ends of the PIN diode 51 with control signal wires 212. By performing ON/OFF control of the PIN diode 51 in the magnetic coupling prevention circuit 602 with a control current 51 from the magnetic coupling prevention circuit drive 115, the birdcage type RF coil 601 is made to function as a transmit RF coil at the time of RF signal transmission, and made to have high impedance so as not to induce interference with the receive RF coil (surface coil 603) at the time of magnetic resonance signal reception. The details of this operation will be described later.

FIG. 17 is a diagram for explaining the configuration of the surface coil 603. In the diagram, the direction of the z-axis of the coordinate 9 is the direction of static magnetic field. The surface coil 603 of this embodiment is fundamentally the same as the surface coil 570 of the first embodiment, but further connected with the magnetic coupling prevention circuit 602 of the active decoupling structure shown in FIG. 16A in series with the surface coil and a capacitor 33'. Value of the capacitor 35 of the magnetic coupling prevention circuit 602' connected in the loop coil in series is made the same value as that of the capacitor 31 of the surface coil 570 of the first embodiment. Further, value of the capacitor 35 of the magnetic coupling prevention circuit 602" connected to the capacitor 33' in series is made such a value that combined value of the capacitor 33' and the capacitor 35 should be the same as that of the capacitor 33 of the surface coil 570 of the first embodiment. ON/OFF of the magnetic coupling prevention circuit 602 is controlled with a control current from the magnetic coupling prevention circuit drive 115, and it makes the surface coil 603 function as a receive RF coil at the time of magnetic resonance signal reception, and makes the surface coil 603 have high impedance so that interference with transmit RF coil (birdcage type coil 601) should not be induced at the time of RF signal transmission.

Immediately before an RF signal having a frequency $f_0$ is fed to the birdcage type coil 601 from the RF generator 106, the magnetic coupling prevention circuit drive 115 sets value of the control current in the control signal wire 212 connected to the PIN diode 51 of the magnetic coupling prevention circuit 602 of the birdcage type coil 601 to be 0, and applies a direct control current so that the PIN diode 51 of the magnetic coupling prevention circuit 602' or 602" of the surface coil 603 should be turned on. The PIN diode 51 is thereby turned on in the magnetic coupling prevention circuit 602' or 602" of the surface coil 603, and the parallel resonant circuit 66 resonates at the frequency $f_0$. As a result, impedance of the surface coil 603 becomes extremely high, current hardly flows in the surface coil 603, and magnetic field is hardly generated, either.

In the birdcage type coil 601, value of the control current which flows into the diode 51 of the magnetic coupling prevention circuit 602 is 0, therefore all the diodes 51 are turned off, thus the parallel resonant circuit 66 becomes a circuit equivalent to a circuit connected only with the capacitor 35, and the birdcage type coil 601 resonates at the frequency $f_0$.

Therefore, there is no magnetic coupling of the birdcage type coil 601 and the surface coil 603, and the birdcage type coil 601 can irradiate an RF magnetic field of the frequency $f_0$ on a test subject 103 without shift of the resonance frequency or decrease in Q value of the coil due to magnetic coupling.

When an RF magnetic field is applied and then magnetic resonance signals emitted from the test subject 103 are received, the magnetic coupling prevention circuit drive 115 applies a control current so that the diode 51 of the magnetic coupling prevention circuit 602 of the birdcage type coil 601 should be turned on, and sets the value of the control current flown in the diode 51 of the magnetic coupling prevention circuit 602' or 602" of the surface coil 603 to be 0. The diode 51 is thereby turned on in the magnetic coupling prevention circuit 602 of the birdcage type coil 601, and the parallel resonant circuit 66 resonates at the frequency $f_0$. As a result, impedance of the birdcage type coil 601 becomes extremely high at the frequency $f_0$, current hardly flows in the birdcage type coil 601, and magnetic field is hardly generated, either.

In the surface coil 603, value of the control current which flows into the diode 51 of the magnetic coupling prevention circuit 602' or 602" is 0, therefore the diode 51 is turned off, and the connection between the inductor 16 and the capacitor 36 is cut off. As a result, the surface coil 603 becomes a circuit equivalent to the surface coil 570 of the first embodiment, and operates as a coil which resonates at the frequency $f_0$.

Therefore, when magnetic resonance signals of the frequency $f_0$ emitted from the test subject 103 are received, there is no magnetic coupling of the birdcage type coil 601 and the surface coil 603, and the surface loop coil 603 receives magnetic resonance signals of the frequency $f_0$ without shift of the resonance frequency or decrease in Q value of the coil due to magnetic coupling.

As described above, if the RF coil 600 of this embodiment is used, magnetic coupling between the birdcage type RF coil 601 tuned to the frequency $f_0$ and the surface coil 603 can be prevented at the time of application of an RF magnetic field and reception of a magnetic resonance signal. As a result, signals can be transmitted as a uniform RF magnetic field having a frequency $f_0$, and the surface coil 603 can simultaneously receive magnetic resonance signals of the frequency $f_0$ with high sensitivity.

According to this embodiment, the shape of the transmit RF coil and the shape of the receive RF coil can be independently chosen as explained above. Therefore, in addition to the effect of the first embodiment, an effect based on the shape of RF coil 116 can also be obtained by this embodiment. For example, by using the birdcage type coil 70 showing high uniformity of irradiation distribution as an transmit RF coil and choosing the shape of the receive RF coil according to shape and size of the test subject 103, an image can be obtained by magnetic resonance imaging optimized for each test subject 103. Of course, the transmit RF coil is not limited to the birdcage type RF coil 601, and the shape of the transmit RF coil can also be selected according to shape and size of the test subject 103.

Although this embodiment has been explained with reference to the case where the RF coil of the first embodiment is used as the receive RF coil, and the conventional RF coil is used as the transmit RF coil 116 as an example, this embodiment is not limited to such an example. The RF coils of the first embodiment or the second embodiment may be used for both the transmit RF coil and the receive RF coil, or the RF coil of the first embodiment or the second embodiment may be used either one of them.

The magnetic coupling prevention circuit 602 used for the receive RF coil is not limited to that of the configuration shown in FIG. 16A. For example, it may be a passive decoupling type circuit such as shown in FIG. 16B. The magnetic coupling prevention circuit 604 shown in FIG. 16B is provided with a cross diode 53 made of a combination of two PIN diodes 52 which are different in direction of polarity, instead of the magnetic coupling prevention circuit drive 115 provided in the magnetic coupling prevention circuit 604 and the PIN diode driven thereby. In the magnetic coupling prevention circuit 604, a series circuit having an inductor 16 and a cross diode 53 connected in series and a capacitor 36 are connected in parallel. The series circuit and the capacitor 36 constitute a parallel resonant circuit 68.

Immediately before an RF signal having a frequency $f_0$ is fed to the birdcage type coil 601 from the RF generator 106, the magnetic coupling prevention circuit drive 115 sets value of the control current flown in the PIN diode 51 of the birdcage type coil 601 to be 0. In the birdcage type coil 601, value of the control current which flows in the PIN diode 51 becomes 0, therefore all the diodes 51 are turned off, thus the parallel resonant circuit 66 becomes a circuit equivalent to a circuit connected only with the capacitor 35, and the birdcage type coil 601 resonates at the frequency $f_0$.

On the other hand, strong electromotive force is generated by magnetic coupling in the surface coil 603 to which the RF magnetic field is fed, the cross diode 53 is turned on, and the parallel resonant circuit 68 resonates at the frequency $f_0$. As a result, impedance of the surface coil 603 becomes extremely high, current hardly flows in the surface coil 603, and magnetic field is hardly generated, either.

Therefore, there is no magnetic coupling of the birdcage type coil 601 and the surface coil 603, and the birdcage type coil 601 can irradiate an RF magnetic field of the frequency $f_0$ on a test subject 103 without shift of the resonance frequency or decrease in Q value of the coil due to magnetic coupling.

When an RF magnetic field is applied and then magnetic resonance signals emitted from the test subject 103 are received, the magnetic coupling prevention circuit drive 115 applies a control current to be flown in the PIN diode 51 of the birdcage type coil 601. By the application of the control current to the birdcage type coil 601, the diode 51 is turned on, and the parallel resonant circuit 68 resonates at the frequency $f_0$. As a result, impedance of the birdcage type coil 601 becomes extremely high at the frequency $f_0$, current hardly flows in the birdcage type coil 601, and magnetic field is hardly generated, either.

The surface coil 603 receives magnetic resonance signals generated by the test subject 103. However, the magnetic resonance signals are extremely weak currents, therefore the cross diode 53 remains in off state, and the inductor 16 is not connected. As a result, the surface coil 603 serves as a circuit equivalent to the surface coil 540 of the first embodiment, and operates as a coil which resonates at the frequency $f_0$.

As described above, if the magnetic coupling prevention circuit 604 is used, the magnetic coupling of the birdcage type RF coil 601 for transmission and the surface coil 603 for reception can be prevented on the receive coil side without using the magnetic coupling prevention circuit drive 115. Therefore, in addition to the effect obtained by the use of the magnetic coupling prevention circuit 602, an effect that the configuration can further be simplified can also be obtained.

In this embodiment, an array coil can also be used as the surface coil 603 of the receive RF coil. FIG. 18 is a diagram showing an example of the array coil 610 used as the receive RF coil of this embodiment. As shown in this diagram, the array coil 610 is provided with multiple surface coils 603 partially overlapping among them. In this diagram, a case where the number of the surface coils 603 is four is shown as an example. The position of overlapping portions of the adjacent surface coils 603 are adjusted so that there should be no magnetic coupling of loop coils 1 of them.

By using the array coil 610 as the receive RF coil, it becomes possible to receive signals from a larger region compared with the case where one surface coil 603 is used as the receive coil. Therefore, it becomes possible to, for example, simultaneously receive magnetic resonance signals from the whole trunk of a test body (patient) as the test subject 103 with high sensitivity, and imaging of a larger region is enabled compared with the case where one surface coil 603 is used.

In the aforementioned embodiments, the signal processing part 214, the capacitor 33 and the inductor 12 (called parallel circuit part) may be covered with a radio shielding 215. The configuration and operation in case that the parallel circuit part is covered with the radio shielding 215 are explained with reference to the solenoid coil 540 of the first embodiment as an example.

FIG. 19 is a diagram for explaining the case where the radio shielding 215 is applied to the solenoid coil 540 of the first embodiment. As shown in this diagram, the parallel circuit part of the solenoid coil 540 is covered with the radio shielding 215. Further, the signal processing circuit 214 is connected to the signal wire 213. In addition, the radio shielding 215 shall be grounded to the earth.

Because the parallel circuit part is covered with the radio shielding 215, influence of the RF magnetic field generated by the loop of the parallel circuit part on the RF magnetic field generated by the series resonant circuit 61 can be reduced. Therefore, with such a configuration, the RF magnetic field can be irradiated with suppressing turbulence of magnetic field generated by the series resonant circuit 61. That is, influence of external noises can be reduced and loss by magnetic coupling can be reduced.

What is claimed is:

1. An RF coil of a magnetic resonance imaging apparatus comprising:
   a series resonant circuit comprising a surface loop coil made of a conductor inserted with a first capacitor,
   an inductor connected in parallel to the series resonant circuit, and
   a second capacitor connected in parallel to the inductor,
   wherein a resonance frequency $f_A$ of the series resonant circuit is tuned to a frequency of a magnetic resonance signal generated by a test subject,
   wherein a parallel resonant circuit constituted by the series resonant circuit, the inductor and the second capacitor has a first resonance frequency $f_B$ which is lower than the resonance frequency $f_A$ of the series resonance circuit and a second resonance frequency $f_C$ which is higher than the resonance frequency $f_A$, and
   wherein a ratio of a first difference between the resonance frequency $f_A$ of the series resonance circuit and the first resonance frequency $f_B$, and a second difference between the resonance frequency $f_A$ and the second resonance frequency $f_C$, is a ratio from 0.5 to 2.0.

2. An RF coil system comprising:
   a transmit RF coil,
   a receive RF coil, and
   a magnetic coupling preventing means, wherein:
   at least one of the receive RF coil and the transmit RF coil is the RF surface coil according to claim 1, and
   the magnetic coupling preventing means makes the receive RF coil in an open state at the time of radio frequency signal transmission, and makes the transmit RF coil in an open state at the time of radio frequency signal reception.

3. The RF coil according to claim 1, wherein:
the loop coil has a solenoid shape.

4. The RF coil according to claim 1, wherein:
the loop coil has a saddle shape constituted by two conductive loops disposed along a cylindrical shape so that the loops should face each other and connected so that directions of magnetic fields generated by the loops should be the same.

5. A magnetic resonance imaging apparatus comprising
a static magnetic field generating means for generating a static magnetic field,
a gradient magnetic field generating means for generating a gradient magnetic field,
a radio frequency magnetic field generating means for generating a radio frequency magnetic field,
a transmit and receive coil which applies the radio frequency magnetic field to a test subject and receives magnetic resonance signals from the test subject, and
a control means for controlling the gradient magnetic field generating means, the radio frequency magnetic field generating means and the transmit and receive coil, wherein:
the transmit and receive coil is the RF surface coil according to claim 1.

6. The RF coil according to claim 1, wherein:
the loop coil has a butterfly shape constituted by two conductive loops adjacently disposed in the same plane and connected so that directions of magnetic fields generated by the loops should be inverse to each other.

7. The RF coil according to claim 1, wherein:
a radio shielding is given to the inductor and the second capacitor.

8. The RF surface coil according to claim 1, wherein:
the ratio of difference between the frequency $f_A$ and the first frequency $f_B$, and difference between the frequency $f_A$ and the second resonance frequency $f_C$, is 1.

9. An RF coil system of a magnetic resonance imaging apparatus comprising:
a first RF coil, and
a second RF coil, wherein:
the first RF coil is the RF surface coil according to claim 1,
the second RF coil is the RF surface coil according to claim 1,
the first RF coil and the second RF coil are disposed so that direction of magnetic field generated by the second RF coil should be perpendicular to direction of magnetic field generated by the first RF coil, and
a phase of a signal applied to the second RF coil is different from a phase of a signal applied to the first RF coil by 90 degrees.

10. A magnetic resonance imaging apparatus comprising
a static magnetic field generating means for generating a static magnetic field,
a gradient magnetic field generating means for generating a gradient magnetic field,
a radio frequency magnetic field generating means for generating a radio frequency magnetic field,
an RF coil system comprising a transmit coil for applying the radio frequency magnetic field to a test subject and a receive coil for receiving magnetic resonance signals from the test subject, and
a control means for controlling the gradient magnetic field generating means, the radio frequency magnetic field generating means and the RF coil system, wherein:
the RF coil system is the RF coil system according to claim 2.

11. The RF coil system according to claim 2, wherein:
the magnetic coupling preventing means comprises:
a first magnetic coupling prevention circuit added to the transmit RF coil,
a second magnetic coupling prevention circuit added to the receive RF coil, and a magnetic coupling prevention circuit driving means, wherein:
the magnetic coupling prevention circuit driving means transmits a control signal to the second magnetic coupling prevention circuit to make the receive RF coil in an open state at the time of radio frequency signal transmission, and transmits a control signal to the first magnetic coupling prevention circuit to make the transmit RF coil in an open state at the time of radio frequency signal reception.

12. The RF coil system according to claim 2, wherein:
the magnetic coupling preventing means comprises:
a first magnetic coupling prevention circuit added to the transmit RF coil,
a second magnetic coupling prevention circuit added to the receive RF coil, and a magnetic coupling prevention circuit driving means, wherein:
the second magnetic coupling prevention circuit comprises a cross diode made of two diodes connected so that they should be in opposite directions, and
the magnetic coupling prevention circuit driving means transmits a control signal to the first magnetic coupling prevention circuit to make the transmit RF coil in an open state at the time of radio frequency signal reception.

13. The RF coil system according to claim 2, wherein:
the receive RF coil is an array coil comprising a plurality of RF surface coils disposed in substantially the same plane so that loop coil portions of the RF surface coils partially overlap.

* * * * *